(12) United States Patent
Price et al.

(10) Patent No.: US 11,075,234 B2
(45) Date of Patent: Jul. 27, 2021

(54) MULTIPLEXED EXPOSURE SENSOR FOR HDR IMAGING

(71) Applicant: MICROSOFT TECHNOLOGY LICENSING, LLC, Redmond, WA (US)

(72) Inventors: Raymond Kirk Price, Redmond, WA (US); Kai Zang, Redmond, WA (US); Michael Bleyer, Seattle, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 660 days.

(21) Appl. No.: 15/943,140

(22) Filed: Apr. 2, 2018

(65) Prior Publication Data
US 2019/0305018 A1    Oct. 3, 2019

(51) Int. Cl.
*H01L 27/146* (2006.01)
*H04N 5/232* (2006.01)
*H04N 5/353* (2011.01)
*H04N 5/378* (2011.01)
(Continued)

(52) U.S. Cl.
CPC .. *H01L 27/14605* (2013.01); *H01L 27/14607* (2013.01); *H01L 27/14645* (2013.01); *H04N 5/2327* (2013.01); *H04N 5/3535* (2013.01); *H04N 5/35554* (2013.01); *H04N 5/35563* (2013.01); *H04N 5/378* (2013.01); *H04N 9/04557* (2018.08)

(58) Field of Classification Search
CPC ......... H01L 27/14605; H01L 27/14607; H01L 27/14603; H01L 27/14601; H01L 27/14643; H01L 27/14645; H04N 5/378; H04N 5/3535; H04N 5/3532; H04N 5/353; H04N 5/351; H04N 5/2327; H04N 5/35554; H04N 5/35563; H04N 9/04557; H04N 9/04551; H04N 9/0455
See application file for complete search history.

(56) References Cited

U.S. PATENT DOCUMENTS 8,035,711 B2 * 10/2011 Liu ..................... H04N 9/04557
348/277
2009/0251556 A1 * 10/2009 Mabuchi ................ H04N 5/363
348/222.1
(Continued)

OTHER PUBLICATIONS

"International Search Report and Written Opinion Issued in PCT Application No. PCT/US2019/023782", dated May 28, 2019, 11 Pages.

Primary Examiner — John R Lee
(74) Attorney, Agent, or Firm — Workman Nydegger

(57) ABSTRACT

Optimizations are provided for a high dynamic range (HDR) sensor. This sensor is a spatially multiplexed image sensor that includes at least two sets of red, green, and blue (RGB) pixels. Each red pixel in the second set of RGB pixels is positioned proximately and sometimes, adjacently, to at least one red pixel in the first set of RGB pixels. Each green pixel in the second set of RGB pixels is positioned proximately to at least one green pixel in the first set of RGB pixels. Each blue pixel in the second set of RGB pixels is positioned proximately to at least one blue pixel in the first set of RGB pixel. This spatially multiplexed image sensor is able to generate a digital image with reduced motion blurring artifacts.

21 Claims, 19 Drawing Sheets

(51) Int. Cl.
*H04N 5/355* (2011.01)
*H04N 9/04* (2006.01)

(56) References Cited

U.S. PATENT DOCUMENTS

| | | | |
|---|---|---|---|
| 2010/0149393 A1* | 6/2010 | Zarnowski | H04N 9/045 348/302 |
| 2010/0328479 A1* | 12/2010 | Sambongi | H01L 27/14609 348/222.1 |
| 2015/0312461 A1* | 10/2015 | Kim | H01L 27/14609 348/308 |
| 2016/0255289 A1* | 9/2016 | Johnson | H04N 9/04557 348/273 |
| 2017/0150076 A1* | 5/2017 | Hizi | H04N 5/35563 |
| 2017/0338258 A1* | 11/2017 | Kim | G02B 3/0056 |
| 2017/0366772 A1* | 12/2017 | Johnson | H04N 5/372 |
| 2018/0176452 A1* | 6/2018 | Nikkanen | H04N 5/3696 |
| 2019/0305018 A1* | 10/2019 | Price | H04N 5/3535 |

\* cited by examiner

MULTIPLEXED EXPOSURE SENSOR FOR HDR IMAGING

BACKGROUND

Typical imaging devices are solid-state devices that include an array of photodetector cells, which are commonly referred to as pixels. Two examples of an imaging device include charge coupled devices (CCD) and complementary metal oxide semiconductor (CMOS) imagers.

A pixel includes an electrical potential well (e.g., a photodiode, photo-capacitor, photogate, etc.) that collects electromagnetic radiation (e.g., a photon). Pixels include discrete collection areas that collect photons during times when the pixel is actively sensing photons (referred to as an exposure period). While photons are being sensed, each pixel generates a charge that is proportional to the amount and/or intensity of the collected photons. Pixels are able to perform these operations because they include photo-conversion components that convert electromagnetic radiation into a charge (i.e. an electrical signal). After a charge is generated by a pixel, the pixel spatially restricts the charge and stores it until the charge is transferred and the pixel is reset. It is possible to control how much charge a pixel will store by adjusting the pixel's exposure period.

In addition to a pixel's exposure period, the size of a pixel's collection area also heavily influences how the pixel operates. For example, the pixel's size influences both its signal to noise ratio (SNR) and its charge saturation capability. Saturation refers to a condition where the pixel has accumulated all of the charge it can store, which means that it can no longer sense any new photons (i.e. its potential well is full to capacity). Because of their larger size, large pixels are able to store more charge than smaller pixels. Thus, larger pixels have a higher saturation level than smaller pixels.

Pixels stop accumulating charge once the exposure period elapses. The imaging device then reads out the signal. For example, CCDs read current and perform off-chip current to voltage conversion. In contrast, CMOS imagers perform charge to voltage conversions at the pixel itself. The voltage is then transferred so that the voltage electrical signal can be used to generate an image corresponding to the sensed photons. This transferring process is generally referred to as a readout of the pixel. During this readout period, the pixel is also reset back to a base charge level so that the pixel can again begin to accumulate charge once a new exposure period begins. As such, the imaging device includes various readout circuits that are connected to the pixels and that perform these readout operations.

Each pixel array also has a determined dynamic range. A dynamic range refers to the range of light that can be sensed by the pixels during their exposure periods. Dynamic range is usually defined as a ratio between the standard deviation of ambient-light noise in a low light condition and the largest non-saturating signal that can be sensed by the pixels. In other words, dynamic range is the difference between the darkest dark and the lightest light that can be captured by the pixel array during a single exposure period.

As an example, consider an office that has a window to the outside. When the sun shines light through the window, the office will have both dark, shadowy areas and brightly lit areas. With traditional imaging techniques, the bright light will quickly saturate any pixels aimed at the brightly lit areas. Typically, an auto-exposure algorithm will set the exposure time to properly expose these areas, and the resulting image will be properly exposed in these bright areas. For pixels aimed at the dark areas, exposure periods are typically not long enough for these pixels to collect an adequate amount of photons, and the resulting image will simply show those areas as an underexposed region of the image. Consequently, the image will have unintelligible, or rather imprecise, whiter or darker areas.

High dynamic range (HDR) imaging was developed in an effort to combat the above problem. As a simple and brief introduction, HDR imaging generates two separate images. One image is generated using a prolonged exposure time to capture enough photons for the dark, shadowy areas. The other image uses a very short exposure time to capture photons for the brightly lit areas. These two images are then blended/stitched together via signal/image processing to generate an image that shows objects in the bright areas (as opposed to simply a washed out white blur) as well as objects in the dark areas (as opposed to simply a dark blur), effectively increasing the dynamic range of the combined images.

While traditional HDR sensors provide accurate and highly dynamic images for static environments, serious problems arise when HDR sensors are used to generate images of environments that include moving objects in the scene. To illustrate, the prolonged exposure times and time difference between the two images for HDR imaging results in imperfect matching between the camera images, and very blurred objects in the images in the regions of the images that had moving objects. What is needed, therefore, is an image sensor and methodology that are able to generate HDR images with simultaneous exposure times for the short and long exposures, enabling HDR images that minimize the effects of motion blur.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Disclosed embodiments are related to methods and systems for improving high dynamic range (HDR) imaging. In some embodiments, a spatially multiplexed image sensor includes a first set of red, green, and blue (RGB) pixels and a second set of RGB pixels. Each red pixel in the second set of RGB pixels is positioned proximately to at least one red pixel in the first set of RGB pixels to thereby form a red effective pixel area (i.e. a pre-determined area on the image sensor devoted only to pixels that sense the same color of light). Similar positions are selected for both green and blue pixels to form green effective pixel areas and blue effective pixel areas. In this manner, pixels from multiple different pixel sets are located near, proximate, or adjacent to each other in a given effective pixel area and form a group of like-colored pixels. Because of their proximate positions, each pixel in the group captures light from essentially the same angular perspective.

In some embodiments, the pixels in the first set are triggered during a first exposure period. During this period, these pixels actively convert sensed light into an electrical signal, which is later extracted from the pixel using a readout circuit. The pixels in the second set also convert light into an electrical signal, which is readout by a different readout circuit than the first set's readout circuit. In some embodiments, the pixels in the second set are active during some of the same time as the pixels in the first set. Consequently, in some embodiments, there is a period of time in which the pixels from multiple sets are simultaneously sensing light and converting that light into different electrical signals. Additionally, in some embodiments, the readout for the second pixel set occurs concurrently with the readout for the first pixel set. In other embodiments the readout of the second pixel set occurs sequentially with the readout of the first pixel set and is based on scenarios where there is limited readout circuitry bandwidth or communications bandwidth. The embodiments use the first and second readouts to generate a combined digital image. By following the disclosed principles, the embodiments are able to reduce or eliminate the effects of motion blurring, regardless of whether those effects are for bright objects or for dim/dark objects.

In some embodiments, each effective pixel area has multiple sets of infrared (IR) pixels. For example, one effective pixel area may include pixels from two (or more) different sets, where each set includes IR pixels. As such, an IR pixel from one set will be proximate to an IR pixel from another set in each effective pixel area. Similar configurations are available for both monochrome pixels and CMYK pixels, or even any other type of pixel.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Figure 1:
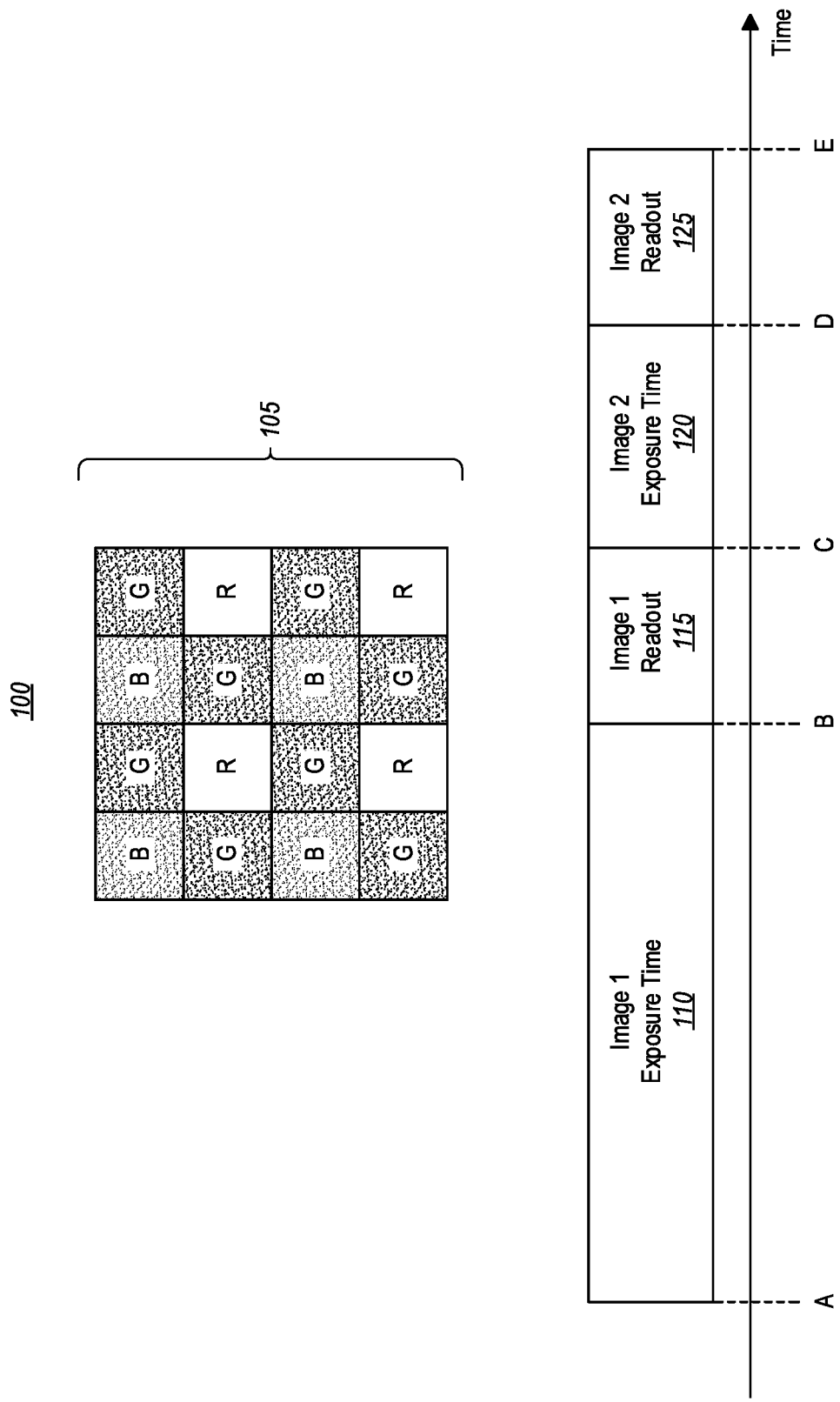
FIG. 1 illustrates a Bayer pattern of how pixels are traditionally configured in an image sensor. To perform traditional high dynamic range (HDR) imaging, the image sensor initially exposes pixels, performs a readout of those pixels to generate a first image, and then repeats that same process a second time to generate a second image.

Disclosed embodiments are directed to methods and systems that improve high dynamic range (HDR) imaging. Some embodiments are focused on a spatially multiplexed image sensor that includes at least two different sets of red, green, and blue (RGB) pixels. Each red pixel in the second set of RGB pixels is positioned proximately to at least one red pixel in the first set of RGB pixels to thereby form a red effective pixel area (i.e. a pre-determined area on the image sensor devoted only to pixels that sense the same color of light). Similar arrangements are made for each green pixel and each blue pixel in the first and second sets to form green effective pixel areas and blue effective pixel areas. In some implementations, each pixel set includes its own independently controllable exposure period and/or readout circuitry.

Using this pixel framework, some embodiments then expose the first set of RGB pixels to light during a first exposure period. As a result, these pixels generate an electrical signal by converting light into electricity. During a second exposure period, the second set of RGB pixels are also exposed to light and generate an electrical signal. In some embodiments, at least a portion of the second exposure period overlaps with at least a portion of the first exposure period such that both pixel sets are sensing light during the same period of time. Additionally, some embodiments cause the readouts for both pixel sets to overlap with one another. Thereafter, a combined digital image is generated by merging the images formed from each pixel set. As a result of using this improved sensor arrangement, the embodiments are able to reduce or eliminate the effects of motion blurring for a moving object, regardless of whether that object is brightly lit or dimly lit.

In this manner, significant advantages are realized both in terms of improvements to HDR technology as well as improvements to how a camera computer system operates. For example, the embodiments significantly reduce/eliminate the effects of image artifacts associated with moving objects, which are quite pronounced in existing HDR technologies. As a result, these operations provide significantly improved HDR digital images. The disclosed embodiments also improve the technology by facilitating parallel processing when obtaining new and improved HDR images. Furthermore, the HDR image alignment algorithm is improved and optimized because the alignment is now much simpler than before. Also, the HDR algorithm is not required to detect or correct for moving objects, so the algorithm is also optimized in this manner. Therefore, the embodiments not only provide a better image, but they also generate these images more efficiently.

Having just described some of the features and technical benefits of the disclosed embodiments at a high level, attention will now be directed to FIGS. 1 through 5 which illustrate some of the conventional methodologies and drawbacks of current HDR technologies. Following that disclosure, attention will turn to FIGS. 6 through 15 which illustrate various frameworks, architectures, and supporting illustrations regarding the disclosed embodiments. FIGS. 16A to 17 will then be discussed. These figures illustrate some example methods and computer systems that may be followed and/or used to achieve the disclosed advantages.

High Dynamic Range Imaging

FIG. 1 shows a traditional framework 100 used to perform HDR imaging. Framework 100 includes a single set 105 of RGB pixels that sense light when generating a HDR image. The time period between points "A" and "B" represents a first exposure period 110 in which the set 105 of RGB pixels is used to sense photons. As shown, this first exposure period 110 is a prolonged period and is used to especially capture photons for low light areas. Once that first exposure period 110 ends, then traditional systems perform a readout 115 to generate a first image. Thereafter, the time period between points "C" and "D" represents a second exposure period 120 in which the same set 105 of RGB pixels is again used to sense photons. As shown, this second exposure period 120 is much shorter than the first exposure period 110 and is used to especially capture photons for brightly light areas. Once this second exposure period 120 ends, then traditional systems will perform another readout 125, which occurs between points "D" and "E." As described earlier, traditional systems will then merge/stitch these two images together to form a HDR image, as generally shown in FIG. 2.

Figure 2:
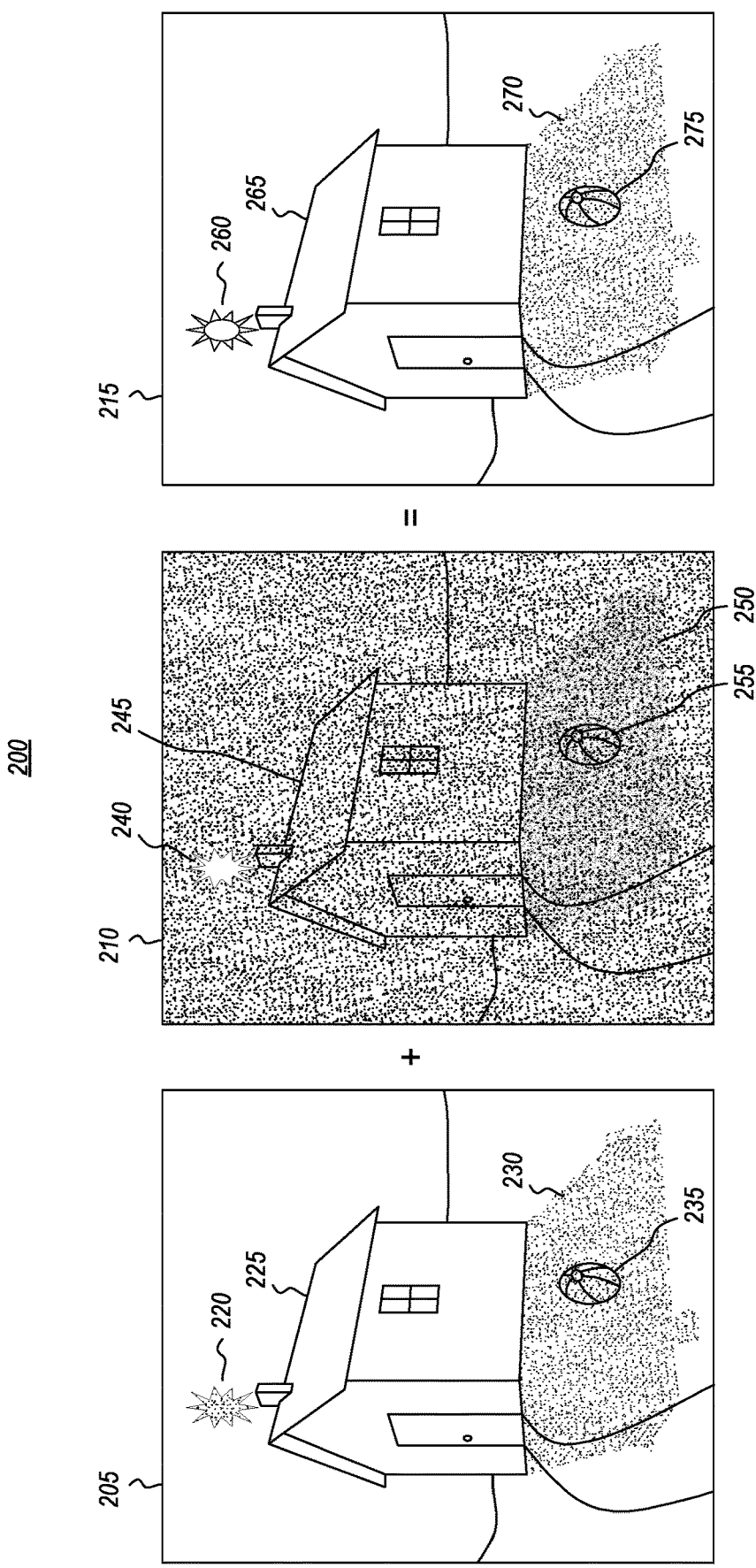
FIG. 2 shows an example implementation of traditional HDR imaging that (1) generates one overexposed image to capture content in low light areas, (2) generates one underexposed image to capture content in brightly lit areas, and (3) generates a high dynamic range image by merging those two images together.

FIG. 2 shows an example 200 of the traditional processes outlined above where three different images (i.e. images 205, 210, and 215) are generated. Images 205 and 210 include the same content but were taken at different times according to traditional HDR imaging techniques. Specifically, image 205 is an image that was generated using a prolonged exposure time (corresponding to exposure time 110 from FIG. 1), image 210 is an image that was generated using a short exposure time (corresponding to exposure time 120 from FIG. 1), and image 215 is the resulting HDR image that is formed by merging image 205 with image 210.

Image 205 shows an overexposed sun 220, a house 225, a shadow 230 (formed from the house 225 blocking out sunlight from the sun 220), and a ball 235 located within the shadow 230. To capture enough photons so that the objects in the shadow 230 (i.e. the ball 235) are visible, the traditional HDR sensor prolongs the exposure period as shown in image 205. Now, the ball 235 is clearly visible as a result of this prolonged exposure period. Additionally, because the exposure period was long, the overexposed sun 220 saturated the pixels causing an indistinct washed-out blur to be generated (for clarity purposes, the sun 220 in image 205 should be considered a washed-out blur because it is overexposed as a result of the long exposure period and it being a bright object). In contrast, image 210 was obtained using a very short exposure period. Here, the sun 240 is clearly and distinctively visible, but the house 245, the shadow 250, and the ball 255 are underexposed.

By selectively choosing which portions of the images 205 and 210 are to be merged together, the HDR sensor is able to provide an image with a high dynamic range as shown by image 215. For instance, as shown in the merged image 215, the sun 260, the house 265, the shadow 270, and the ball 275 are all clearly and distinctively identifiable, particularly the sun 260 and the ball 275 which, if traditional non-HDR imaging techniques were used, may result in a washed-out white blur or a blacked-out blur, respectively. In some situations, however, the images may simply be less clear because some auto-exposure algorithms do not allow for both over and underexposed regions. Accordingly, FIG. 2 illustrates traditional HDR imaging, which is beneficial for static environments where no objects are moving.

Figure 3:
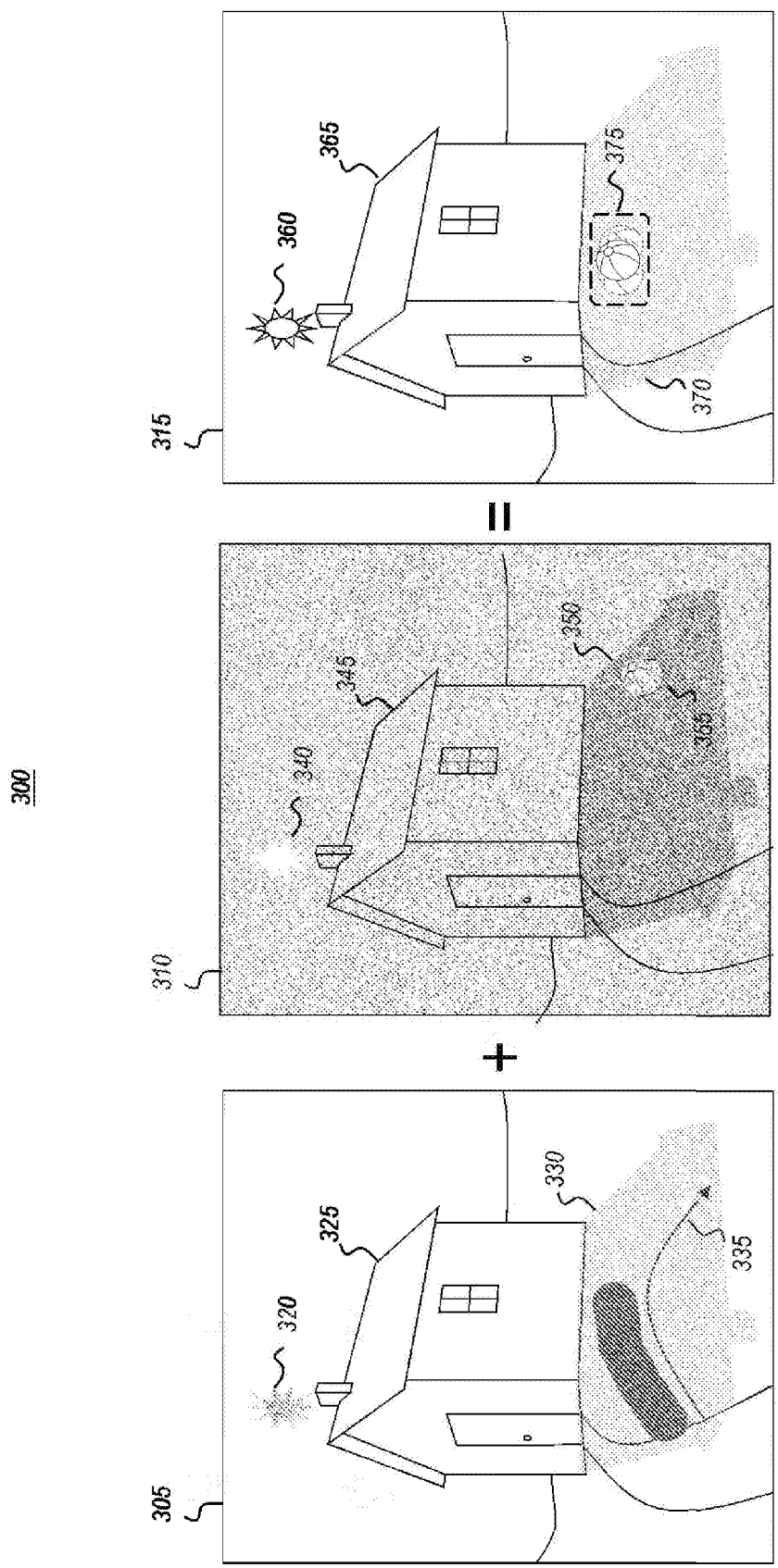
FIG. 3 shows another example implementation of traditional HDR imaging, but in a scenario where an object is moving, thereby creating blurred/smeared effects and other artifacts in the HDR image.

In contrast to FIG. 2's static environment, however, FIG. 3 shows an example 300 where an environment includes a moving object. Similar to FIG. 2, image 305 is a long exposure image, image 310 is a short exposure image, and image 315 is a merged combination of images 305 and 310 which was generated using traditional HDR imaging techniques.

Image 305 includes a sun 320, a house 325, a shadow 330, and a moving ball 335. Because the exposure period was prolonged for image 305, it is apparent that the ball 335 moved from one location to another. Consequently, image 305 includes blurring effects associated with the moving ball 335.

Image 310 includes a sun 340, a house 345, a shadow 350, and a blurred ball 355 that is moving (as represented by the arrow). Image 310, however, was generated using a short exposure period. As a result, the sun 340 is clearly and distinctively visible, but the house 345, the shadow 350, and the ball 355 are not clear because not enough photons were collected to distinctively identify those elements. Furthermore, because the exposure period was so short, the ball 355 was captured at a specific point in time, thus there are reduced or even no blurring effects in image 310.

When image 305 is combined with image 310 to form image 315, the sun 360 is clearly and distinctively defined as well as the house 365 and the shadow 370. The ball 375, however, has some blurring artifacts as a result of the merging operations. These blurring artifacts are more clearly visible in FIG. 4.

Figure 4:
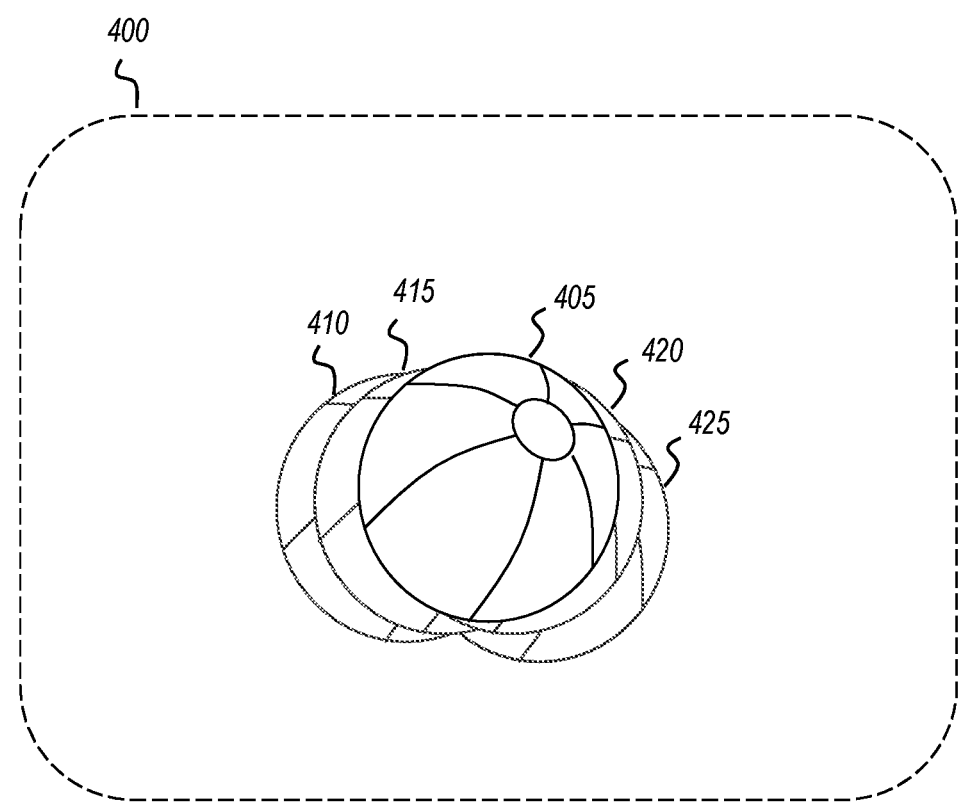
FIG. 4 is a blowup illustration of the artifacts that occur when an HDR image is taken of a moving object.

As shown, FIG. 4 includes the snapshot 400 of a ball 405, which is representative of the ball 375 from FIG. 3. Additionally, FIG. 4 shows various different blurring artifacts, namely artifacts 410, 415, 420, and 425. These blurring artifacts occur as a result of merging image 305 with image 310 from FIG. 3. This ball 405 will have blurred effects and will have the artifacts around it as a result of the image merging operations. This will appear as a blur or smear on the exposed/resultant image.

Figure 5:
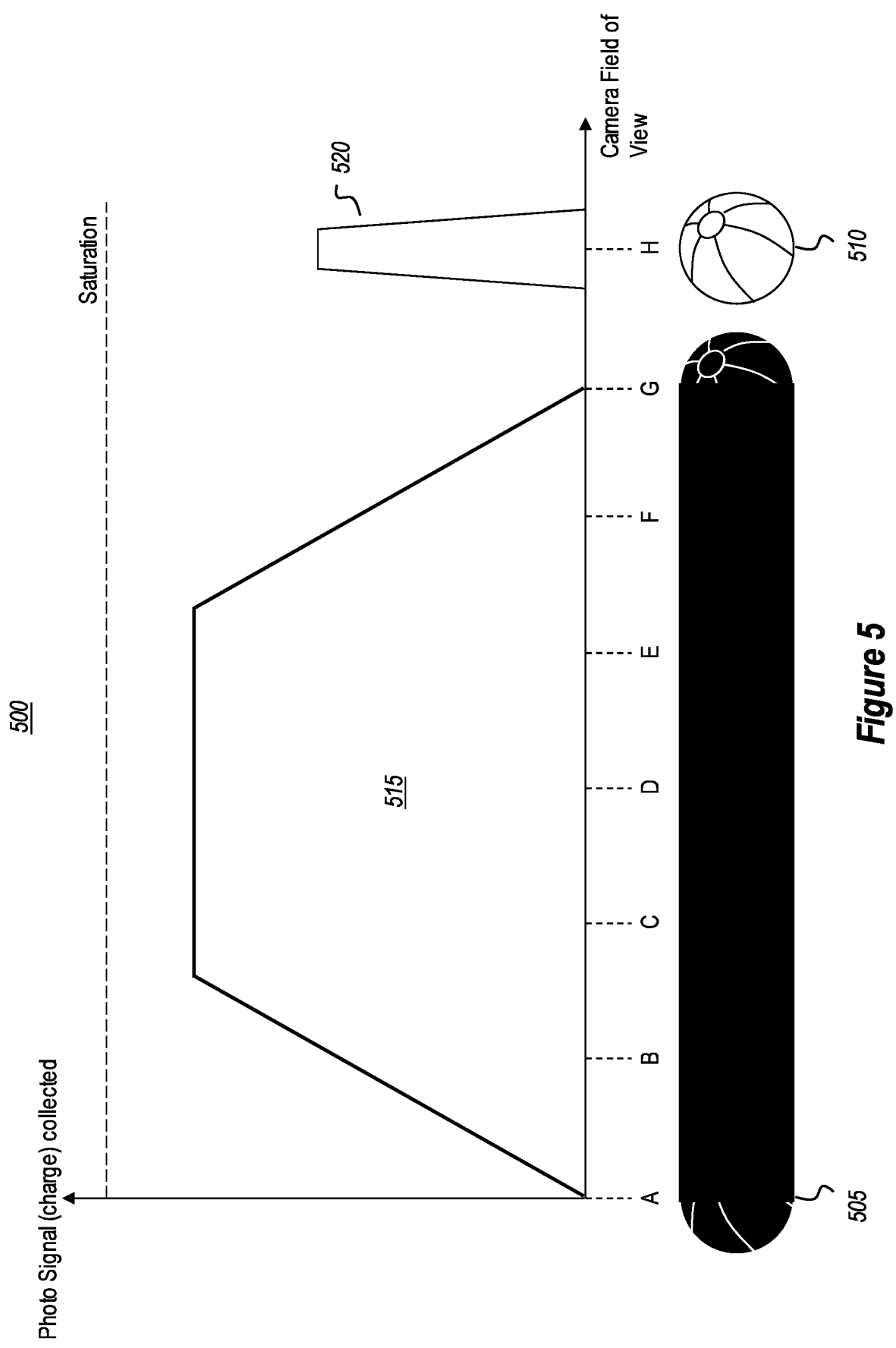
FIG. 5 illustrates the sequential exposure times that traditional HDR imaging sensors use.

FIG. 5 demonstrates that these blurring artifacts occur as a consequence of a temporal and spatial offset/delta resulting from the ball's movement. For example, the blurred ball 505 corresponds to the blurred ball 335 from FIG. 3 and which is produced as a result of the long exposure time. FIG. 5 also shows a time period between the blurred ball 505 and the ball 510, which is similar to the ball 355 in FIG. 3. As shown in FIG. 5, there is a temporal offset between the image that captured the blurred ball 505 and the image that captured the ball 510

The graph 500 shows that the x-axis portrays the image sensor's/camera's field of view, or rather a 1D pixel array response. The y-axis illustrates the photo signal (e.g., charge) that is collected by the pixels in the image sensor. As shown, the ball moves across the camera's field of view. For instance, the ball 505 moves from position A and eventually reaches position H as shown by ball 510 (e.g., from A to B, to C, to D, to E, to F, to G, and finally to H). The plot 515 corresponds to a long exposure image (e.g., image 305 from FIG. 3 and exposure time 110 from FIG. 1) while the plot 520 corresponds to a short exposure image (e.g., image 310 and exposure time 120).

The blurring artifacts from FIG. 4 result because the ball is at different locations during the first exposure period (corresponding to plot 515 and points "A" through "G") resulting in image smear, as shown by the smeared ball 505 between points "A" and "G," and during the second exposure period (corresponding to plot 520 and point "H"). Furthermore, the temporal delta occurs not only as a result of the differences in the exposure periods, but also as a result of the time required to perform the readout operation after obtaining each image (e.g., the time in FIG. 1 between points "B" and "C"). Such blurring artifacts are especially prevalent when bright objects are moving, such as for example, with automobile cameras or night time imaging performed in a busy environment. With that understanding, it is clearly desirable to provide a methodology and framework that avoids these undesired blurring effects. In most situations, the photo signals will not reach saturation (as shown by the saturation line in FIG. 5), though it is possible, in extreme cases, to reach saturation.

New Pixel Configurations to Improve HDR Imaging

FIGS. 6 through 9 illustrate a new sensor design that eliminates the exposure delay between multiple HDR images. This new design allows HDR images to be captured without the negative blurring effects due to moving objects in the environment. This new pixel design incorporates multiple, separately addressable pixels for each effective pixel area, which was defined earlier. By providing an effective pixel area that includes multiple pixel sets, the image sensor is considered to be spatially multiplexed. In some embodiments, the spatially multiplexed image sensor is a global shutter sensor while in other embodiments it is a rolling shutter sensor.

In this regard, multiple different pixel sets are co-located and co-aligned such that they collect photons from essentially the same perspective or angular reference. As will be discussed later, any number of addressable pixel sets may be used (e.g., 2, 3, 4, or more than 4). Furthermore, in some instances, the corresponding pixel areas (e.g., large pixel and a small pixel of the same color area) are positioned adjacent to one another (e.g., a larger red pixel is positioned adjacent a smaller red pixel). In other embodiments, the corresponding pixel areas are not positioned adjacently, but are instead simply positioned on the same sensor (being proximate one another), rather than being directly adjacent to one another.

For example, a small red pixel belonging to an overall red pixel color area may be positioned proximate to a larger red pixel from the red pixel area, but not directly adjacent to the larger red pixel color area. Instead, the small red pixel may be positioned adjacent to a second and different pixel color (e.g., a larger blue pixel belonging to a blue effective pixel area) and while only being positioned proximate the larger red pixel. In such an embodiment, the positioning of the R2 and B2 pixels on the sensor could be switched, for example. In view of the foregoing description, it will be appreciated that the term 'proximate,' as used for the described effective pixel areas, includes adjacent and non-adjacent positioning of the corresponding pixels on the sensor. Because each pixel set has its own wiring, the exposure periods, readout periods, and reset periods for each pixel set are separately controllable. This configuration produces an image sensor capable of providing highly dynamic and/or variable exposure periods (e.g., shorter or longer exposure periods on demand).

As a reference, the remaining figures use a particular numbering scheme to differentiate pixel sets. Specifically, pixels with a number "1" indication (e.g., any pixels labeled as "R1," "G1," and "B1") belong to a first set of addressable pixels. Any pixels with a number "2" indication (e.g., "R2," "G2," and "B2") belong to the second set of addressable pixels, and so on.

Figure 6:
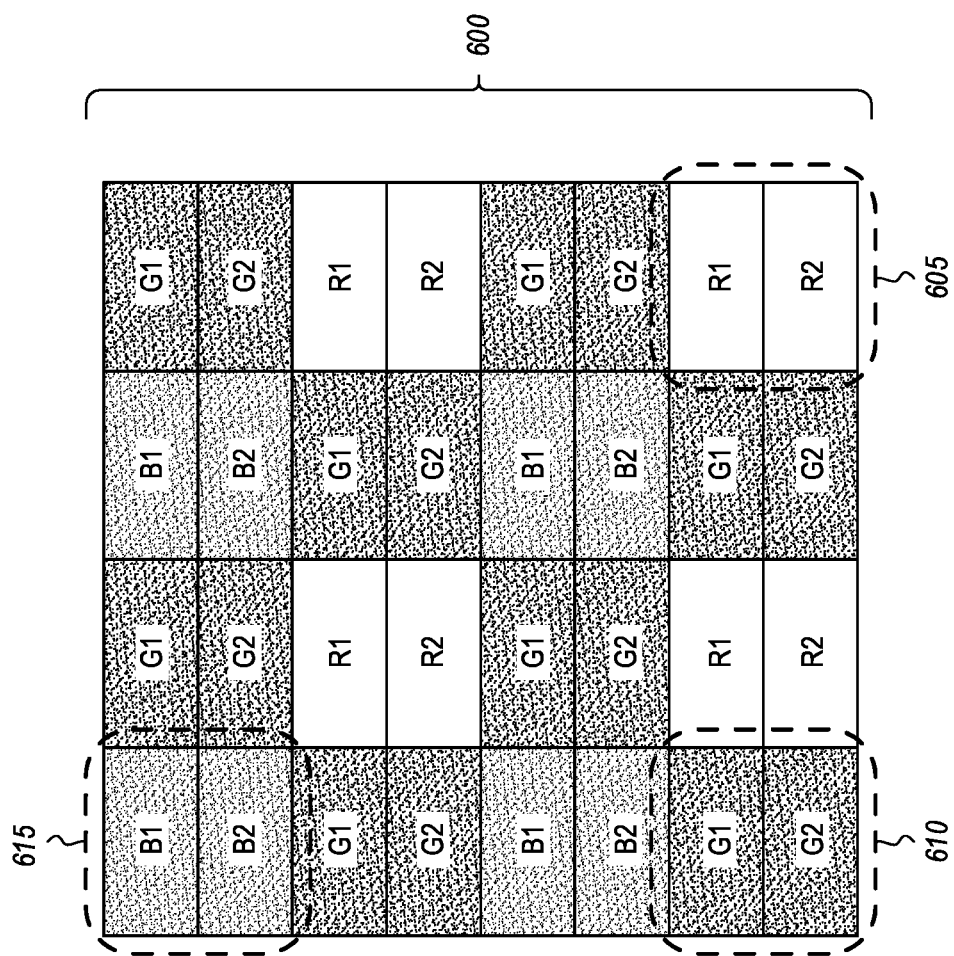
FIG. 6 shows an example of a new pixel layout/framework that improves HDR imaging.

Attention will now be directed to FIG. 6 which shows a configuration 600 in which two different pixel sets are provided in the same effective pixel area. Though separately addressable, all pixel sets in any given effective pixel area are co-positioned so that no spatial offset (or disparity) will exist between the images captured by those pixel sets. Because there is no disparity, the resulting images will be perfectly aligned for both camera orientation and lens distortion parameters.

As shown, the red effective pixel area 605 includes a red pixel R1 from set 1 and a red pixel R2 from set 2. As discussed, this red effective pixel area 605 includes pixels that detect only red light. The green effective pixel area 610 includes a green pixel G1 from set 1 and a green pixel G2 from set 2. The blue effective pixel area 615 includes a blue pixel B1 from set 1 and a blue pixel B2 from set 2. Accordingly, each red pixel in the second set of RGB pixels is positioned proximately to at least one red pixel from another set of RGB pixels (e.g., set 1) within the same red effective pixel area. Similarly, each green pixel in the second set is positioned proximately to at least one green pixel from another set within the same green effective pixel area, and each blue pixel in the second set is positioned proximately to at least one blue pixel from another set within the same blue effective pixel area.

It will be appreciated that the sizes, shapes, orientations, and/or locations of the pixels within a given effective pixel area may be different. In configuration 600, each pixel in the second set has the same size, shape, and orientation (i.e. horizontal rectangle) as each pixel in the first set, and all of the pixels are symmetric in shape. This is not a requirement, however.

For instance, one, some, or all of the pixels in a particular effective pixel area may be shaped as circles, triangles, squares, rectangles, pentagons, hexagons, or any other polygon. Similarly, one or more pixels in a particular effective pixel area may have one shape while one or more other pixels in that same effective pixel area may have a different shape.

Additionally, one, some, or all of the pixels in a particular effective pixel area may be symmetrically shaped. Alternatively, one or more pixels within the same effective pixel area may be asymmetrically shaped. Indeed, the same effective pixel area may include one or more symmetrically shaped pixels and one or more asymmetrically shaped pixels.

Additionally, the physical sizes of the pixels may vary. As will be discussed in more detail below, one or more pixels in a particular effective pixel area may have one size while one or more other pixels in that same effective pixel area may have a different size. According to the disclosed embodiments, the preferred pixel size ranges anywhere from 0.81 square microns (e.g., a 0.9 µm by 0.9 µm pixel) up to and including 400 square microns in area (e.g., a 20 µm by 20 µm pixel).

Therefore, it will be appreciated that each pixel in an effective pixel area may be uniquely sized, shaped, oriented, and/or located. Accordingly, examples of some of the different configurations for each pixel in an effective pixel area will now be presented in connection with FIGS. 7 through 9.

Figure 7:
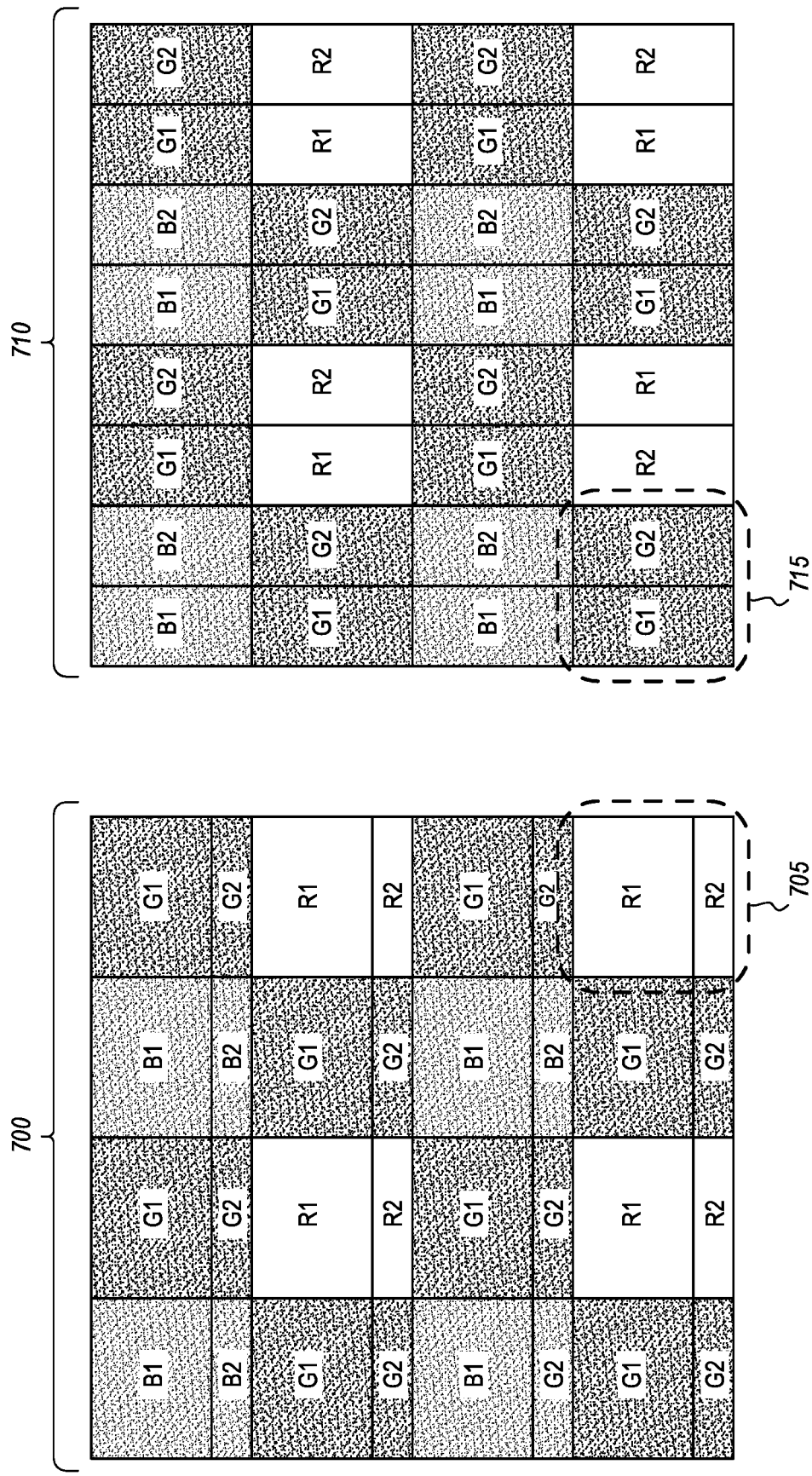
FIG. 7 illustrates two additional pixel layouts/frameworks that improve HDR imaging.

FIG. 7 shows two different configurations 700 and 710. In configuration 700, the pixels in the first set are sized differently than the pixels in the second set. For example, the effective pixel area 705 shows that pixel R1 is significantly larger than pixel R2. This difference in size and/or proportionality may be designed to be any value, as described below.

For example, the size of a first pixel in a particular effective pixel area may be 1/16, 1/8, 3/16, 1/4, 5/16, 3/8, 7/16, 1/2, 9/16, 5/8, 11/16, 3/4, 13/16, 7/8, 15/16 or the same size as another pixel in the same effective pixel area. Any other proportional value may be used as well. Relatedly, the sizes may be based on the proportionality in relation to the effective pixel area. For instance, the size of a first pixel in a particular effective pixel area may be 5%, 10%, 15% 20%, 25%, 30%, 35% 40% 45%, 50%, 55% (and so on) of the effective pixel area. Correspondingly, the size of a second pixel in the same effective pixel area may be 95%, 90%, 85%, 80%, 75%, 70%, 65%, 60%, 55%, 50%, 45% (and so on) of that effective pixel area. It will be appreciated that any size, shape, orientation, and/or location discussed in connection with one configuration (e.g., configuration 700) may be applied to any of the other configurations mentioned herein.

Configuration 710 shows an arrangement that is somewhat similar to configuration 600. Now, however, the pixels in configuration 710 are oriented differently (e.g., the pixels in the effective pixel area 715 are vertical rectangles).

Figure 8:
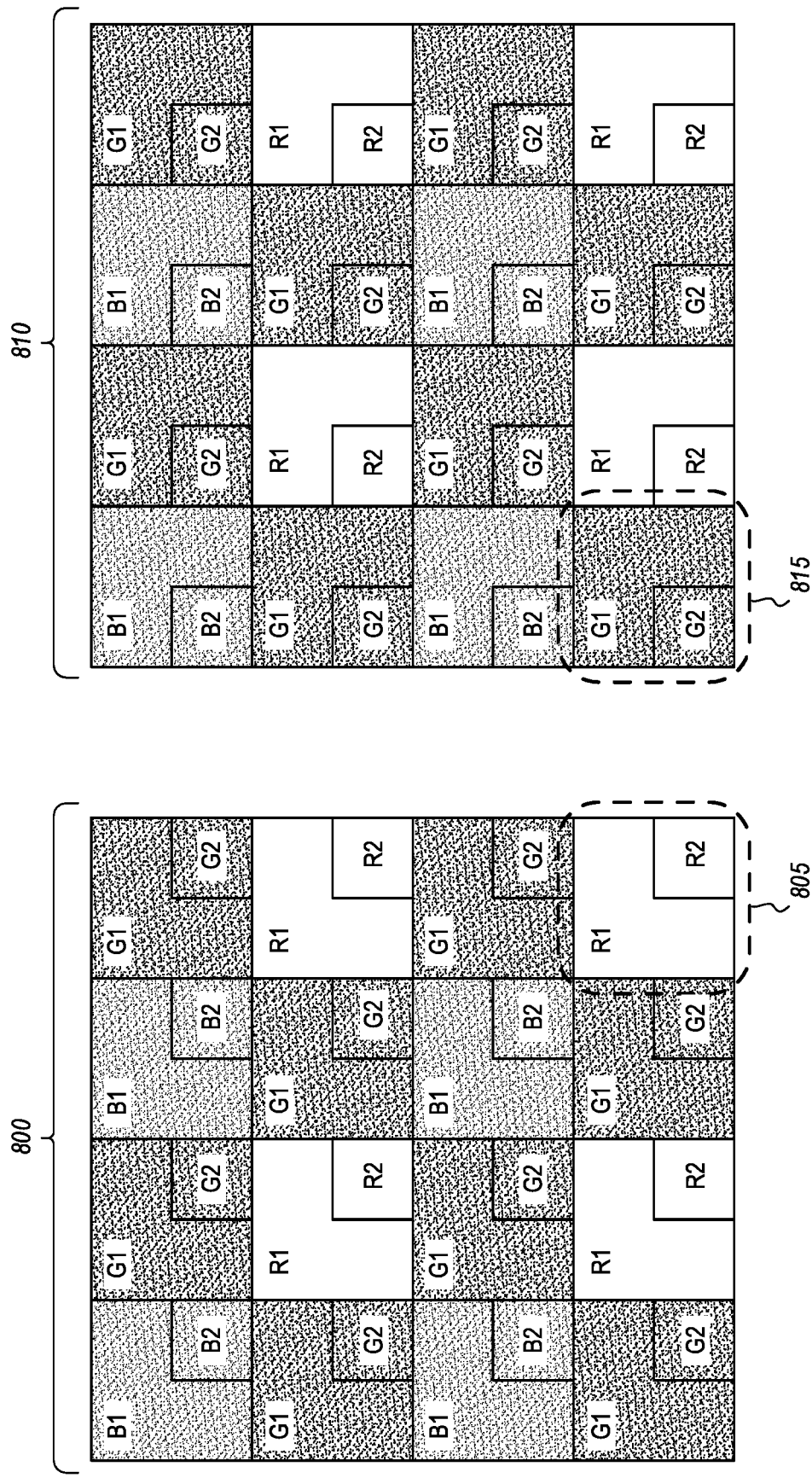
FIG. 8 illustrates another set of new pixel layouts that improve HDR imaging.

FIG. 8 shows two additional example configurations 800 and 810. In configuration 800, one pixel in a particular effective pixel area (e.g., effective pixel area 805) is shaped symmetrically (e.g., a square) while another pixel in effective pixel area 805 is shaped asymmetrically. Specifically, the pixels in set 2 are squares, and the pixels in set 1 are shaped as right-angled hexagons. Consequently, the form factor for the effective pixel area 805 is a square even though the two individual pixels are shaped differently (i.e. the form factor for the combined areas of pixels R1 and R2 is a square shape).

A similar arrangement is shown in configuration 810. Here, however, the pixels in the second set are on the left side of the pixels in the first set (as shown by the effective pixel area 815) as opposed to being on the right side (as shown by the effective pixel area 805). In some embodiments, the pixels in the second set are located on the upper left or upper right regions as opposed to the lower left or lower right. Accordingly, as shown by the configurations in FIGS. 7 and 8, each pixel in the second set may have a different size, shape, orientation, and/or location than each pixel in the first set within a particular effective pixel area.

A non-limiting example will be helpful. Using configuration 800 from FIG. 8, suppose each pixel in the second set (e.g., R2, G2, and B2) has a dimension of 1 micron by 1 microns (of course other dimensions may be used e.g., 1.5 microns by 1.5 microns (or smaller/larger)). This results in each pixel in the second set having a total surface area of 1.0 square microns. Further suppose that each pixel in the first set (e.g., R1, G1, and B1) has dimensions of 3 microns by 3 microns by 2 microns by 1 micron by 1 micron by 2 microns. This results in each pixel in the first set having a total surface area of 8.0 square microns. Therefore, the combined surface area of effective pixel area 805 will be 9.0 square microns. In this regard, R1 occupies roughly 89% of effective pixel area 805, and R2 occupies roughly 11% of effective pixel area 805. Furthermore, R2 is 12.5% the size of R1. Accordingly, the pixels may be designed to satisfy any condition.

Figure 9:
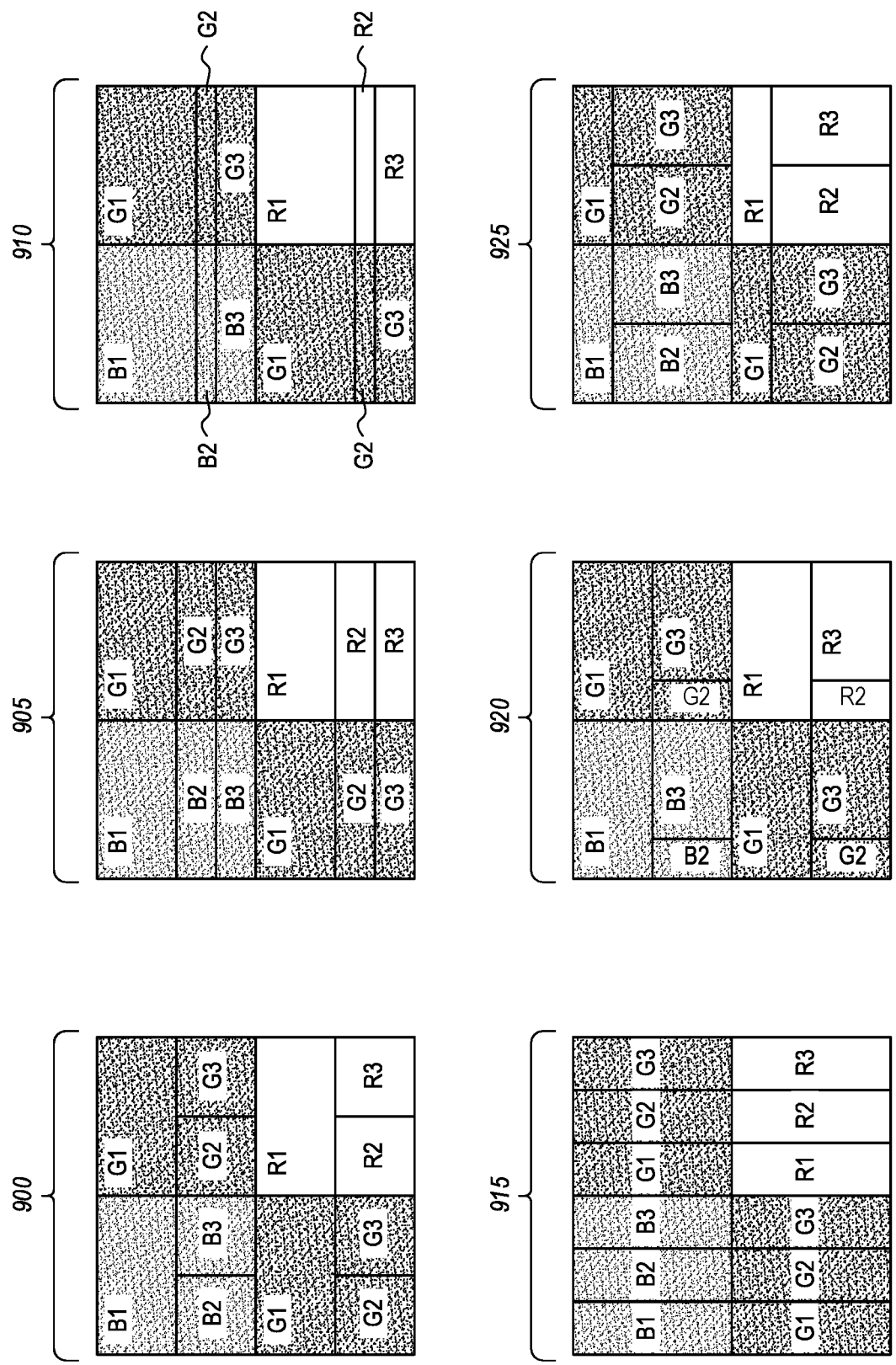
FIG. 9 shows yet another set of new pixel layouts that may be used to improve HDR imaging.

FIG. 9 shows six additional configurations, namely, configurations 900, 905, 910, 915, 920, and 925. In these configurations, the spatially multiplexed image sensor includes a third set of RGB pixels. As such, each red pixel in the third set is positioned proximately to at least one red pixel in the first set or second set of RGB pixels (within a particular red effective pixel area). Similarly, each green pixel in the third set is positioned proximately to at least one green pixel in the first set of RGB pixels or second set of RGB pixels, and each blue pixel in the third set is positioned proximately to at least one blue pixel in the first set of RGB pixels or the second set of RGB pixels. In this regard, each effective pixel area includes at least three different pixel sets.

Configuration 900 shows that the pixels in sets 2 and 3 have the same shape, size, and orientation within a given effective pixel area while the pixel in set 1 has a different size, shape, and orientation in that same effective pixel area. Here, the pixels in sets 2 and 3 are shaped as squares and are located on the bottom portion of the rectangular pixel of set 1.

Configuration 905 shows that the pixels in sets 2 and 3 are again the same size, shape, and orientation, but now they are rectangles as opposed to squares. Furthermore, the pixels in set 2 are located in between the pixels of sets 1 and 3 such that the pixels of set 3 are not immediately adjacent to the pixels in set 1. As a result, one or more pixels in an effective pixel area may not be immediately adjacent to one or more other pixels in that effective pixel area, yet they may all still be included within the same effective pixel area and they are all still proximate to each other.

Configuration 910 shows that the pixels in sets 1, 2, and 3 are all rectangles, but none of the pixels are the same size. Furthermore, the pixels in set 2 are positioned in between the pixels of sets 1 and 3 such that the pixels in set 3 are not adjacent to the pixels in set 1 in a particular effective pixel area. Recall, the proportional sizing of the pixels in sets 1, 2, and 3 may vary in the manner described earlier but now tailored to situations involving three or more pixels. As a brief example, a pixel in set 1 may occupy 70% of a particular effective pixel area, a pixel in set 2 may occupy 10% of that effective pixel area, and a pixel in set 3 may occupy 20% of that effective pixel area. Relatedly, a pixel in set 2 may have half the surface area of a pixel in set 1, and a pixel in set 3 may have half the surface area of the pixel in set 2 (such that the pixel in set 3 is one-fourth the size of the pixel in set 1). Of course, other dimensions may be used as well.

Configuration 915 shows that the pixels in sets 1, 2, and 3 are all sized, shaped, and oriented (e.g., a vertical rectangular orientation) similarly to each other. Furthermore, the pixels in set 2 are located in between the pixels of sets 1 and 3 for a given effective pixel area.

Configuration 920 shows that the pixels in sets 1, 2, and 3 are all sized and oriented differently. Specifically (and for each effective pixel area), the pixels in set 1 are large horizontal rectangles, the pixels in set 2 are medium sized horizontal rectangles, and the pixels in set 3 are small vertical rectangles. Additionally, the pixels in each set are located proximately to each other.

Configuration 925 shows that the pixels in sets 2 and 3 are shaped, sized, and oriented in a similar manner, but the pixels in set 1 are sized and oriented differently. Furthermore, the pixels in each set are located proximately to each other. Accordingly, FIGS. 6 through 9 illustrated various different example configurations in which pixels from different sets may be co-located so that there is no spatial disparity between the images that each set produces. Although squares, rectangles, and hexagons were used in the examples, circles, triangles, pentagons, or any other type of polygon shape may also be used for the pixels.

It will be appreciated that the inclusion of multiple pixel sets within each effective pixel area (e.g., a R1 pixel and a R2 pixel in the same effective pixel area) does not decrease the overall spatial resolution of the sensor. It does, however, decrease the effective pixel size/area of each individual pixel. For instance, suppose a 1M (1K×1K image sensor) is provided. Here, the sensor resolution would include 1K×1K pixels, regardless of whether the pixels were exposed in different manners (i.e. constituting a multiple exposure HDR mode which is described below). However, if only one set of pixels was used to capture an image and then another set was used to capture a different image, the effective pixel size would be reduced by a factor of two times, which will impact the camera's SNR, full well capacity, and/or low light sensitivity.

To address this, the embodiments include a mechanism for selectively altering HDR modes. These modes include a first mode where all of the pixels in an effective pixel area operate in unison/sync to thereby perform traditional HDR imaging (as shown in FIG. 1). This mode is beneficially used when there are no moving objects in the environment. If, however, there are moving objects in the environment, then the imaging device may be configured to operate in a multiple exposure HDR mode, as described below in connection with FIGS. 10 through 14.

Multiple Exposure HDR Mode

Figure 10:
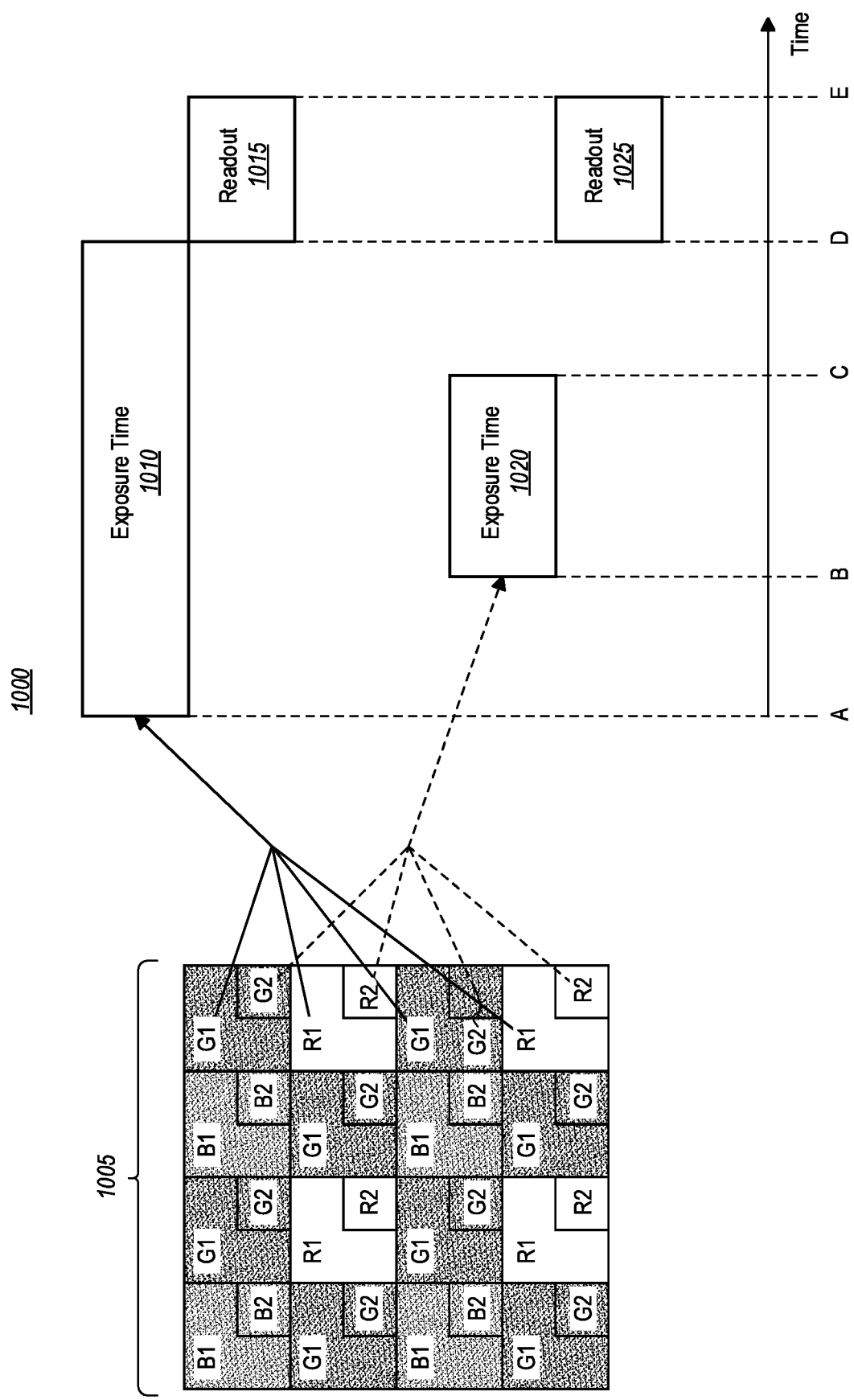
FIG. 10 demonstrates how the new configuration of pixels may be used to generate a HDR image by overlapping the pixel sets' exposure periods and/or their readout periods.

Attention will now be directed to FIG. 10 which shows an example 1000 of pixel exposure periods for an example configuration 1005. While the configuration 1005 is the same as configuration 800 from FIG. 8, it will be appreciated that any of the configurations from FIGS. 6 through 9 may have been used.

In contrast to the sequential exposure and readout periods shown in FIG. 1, FIG. 10 shows that portions of the exposure periods for the different pixel sets overlap and that portions of the readout periods for the different pixel sets also overlap. The exposure period (or time) 1010 and the readout period 1015 both correspond to the pixels in set 1 (e.g., R1, G1, and B1), and the exposure period 1020 and the readout period 1025 both correspond to the pixels in set 2 (e.g., R2, G2, and B2). If a third (or fourth, fifth, etc.) set of pixels were provided, then a third exposure period and a third readout period would also be provided.

The exposure period 1010 begins at point "A" and ends at point "D." The readout period 1015 then begins at point "D" and ends at point "E." In this example 1000, the entire exposure period 1020 overlaps with the exposure period 1010 in that the exposure period 1020 begins at point "B" and ends at point "C," both of which are included between points "A" and "D." In some embodiments, however, only a portion of the exposure time 1020 overlaps with the exposure time 1010. By overlapping at least some of the exposure times for the different pixel sets, the blurring effects (also called "ghosting") will be significantly reduced or even completely eliminated via image processing, which is described in more detail later.

As described earlier, the image sensor is able to dynamically adjust the exposure times such that they may not be the same for each exposure instance. Preferred exposure times for the long exposure period (corresponding to exposure period 1010) typically range anywhere from 10 microseconds up to and including 200 milli-seconds. Preferred exposure times for the short exposure period (corresponding to exposure period 1020) typically range anywhere from 5 micro-seconds up to and including 200 micro-seconds. In some embodiments, the exposure period for one pixel set ranges anywhere from 2 to 20 times as long as the exposure period for a different pixel set.

In some embodiments, the exposure period is a function of a pixel's collection area (i.e. its surface area). Using configuration 800 from FIG. 8 as an example, the large pixels (i.e. the pixels in set 1) may be used to collect photons for low light environments, thus reducing the length of the exposure proportional to the size of the pixel. Because of the larger pixel size, the image sensor may determine that these pixels do not need a prolonged exposure period to collect photons. Alternatively, the image sensor may determine that they do need a prolonged exposure period precisely because they are collecting photons for low light areas. The same reasoning may be applied to the smaller pixels (i.e. the pixels in set 2). As such, an exposure period may be based on the pixel's surface area.

In another embodiment, the relationship between the exposure periods for different pixel sets may also be determined by a function based on collection area. For instance, the collection area (call it "A1") of a first set of pixels multiplied by the exposure period ("E1") for that first set of pixels (i.e. A1*E2) may be some multiplier of the collection area ("A2") of a second set of pixels multiplied by the exposure period ("E2") for that second set of pixels (i.e. (A1*E1)*x=(A2*E2)).

In FIG. 10, the readout period 1025 entirely overlaps with the readout period 1015. In some embodiments, the readout periods span the same amount of time (as in FIG. 10) while in other embodiments the readout periods differ in duration. In some embodiments, one readout period entirely overlaps the other readout period (again as shown in FIG. 10), while in other embodiments only portions of the readout periods overlap with each other. Readout rates are usually described in pixels per second, and preferred readout rates range anywhere from 10 Mega-pixel/second up to and including 1000 Mega-pixels/second. In situations where a global shutter image sensor is used, the readout may actually be shared or be done sequentially. This is available when each pixel can be appropriately reset.

Figure 11A:
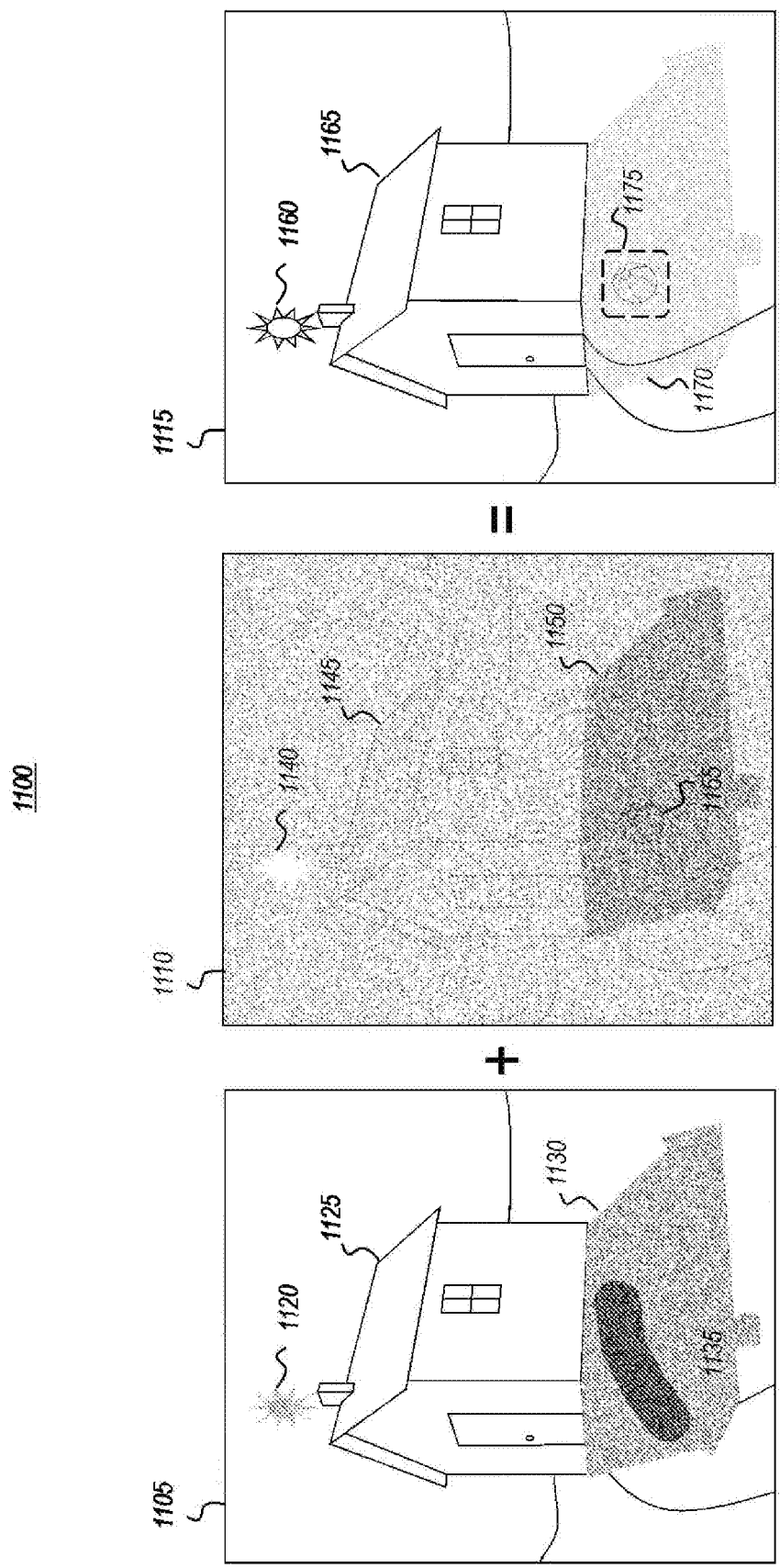
FIGS. 11A and 11B demonstrate how the new configuration of pixels improves HDR imaging by reducing or even eliminating motion blur artifacts.

Attention will now be direct to FIG. 11A which illustrates an example 1100 similar to the example 300 from FIG. 3 in that three separate images are generated. Image 1105 is a prolonged exposure image, image 1110 is a short exposure image, and image 1115 is a merged image formed from the selective combination of selected portions of images 1105 and 1110.

As shown, image 1105 includes an overexposed sun 1120, a house 1125, a shadow 1130, and a moving ball 1135. Because the exposure period was prolonged, the sun 1120 will appear as a white, washed out blur. In contrast, the non-moving objects in the shadow 1130 will be clearly and distinctively defined. This is achieved because the photons aimed at that dark area were exposed for a sufficient amount of time and captured enough photons. However, the moving objects (e.g., the moving ball 1135) will be blurred/smeared. Image 1105 was captured using a first pixel set (e.g., pixels R1, G1, and B1 in FIG. 10). In situations where a large pixel is used to capture the image 1105, then the exposure time for this large pixel may be reduced, thus shortening or reducing the motion blur shown by the blurred ball 1135.

Image 1110 is a short exposure image. Here, the sun 1140 is clearly and distinctively defined because the pixels were exposed only for a very short period of time. In contrast, the house 1145, the shadow 1150, and the ball 1155 may not be distinctively shown because the pixels aimed in those directions were not exposed for a long time. Image 1110 was captured using a second pixel set (e.g., pixels R2, G2, and B2 in FIG. 10). According to the disclosed embodiments, the pixels used to generate image 1105 were exposed for at least some of the same time as the pixels used to generate image 1110. As a result, images 1105 and 1110 are coordinated images because their exposure times overlap.

Subsequently, signal/image processing is performed to stitch/merge portions of image 1105 with portions of image 1110. As the camera orientation and lens distortion is in exactly the same position for the two images, the image alignment and merging steps are substantially simplified. As a result, the operations for merging the two images together are significantly improved and the camera computer system is able to provide a better HDR image. For example, the camera computer system is able to determine that the relevant portions of image 1105 are the house 1125, the shadow 1130 and the moving ball 1135. Because the sun 1120 will be a white, washed-out blur, the camera computer system can selectively isolate various portions of the image 1105 so that those portions may or may not be included in the merged image 1115 (or those portions may not heavily influence the merged image 1115). Similarly, the camera computer system is able to determine that the sun 1140 is the most relevant portion in image 1110 as opposed to the house 1145, the shadow 1150, and/or the ball 1155.

In some embodiments, the camera computer system also identifies when an object is moving. For instance, the camera computer system is able to analyze image 1105 and identify that the moving ball 1135 is not stationary and that there are blurring effects in image 1105. When the camera computer system identifies such situations, then the camera computer system may determine that objects in image 1110 should be weighted more heavily. For instance, the camera computer system is able to determine that the position, shape, and/or other visible characteristics of ball 1155 should be weighted more heavily in its image processing. By merging the information associated with the moving ball 1135 with the information associated with ball 1155, the camera computer system is able to produce the merged image 1115 which has little to no blurring artifacts because of the overlapping exposure periods. For instance, the image 1115 shows a clear and distinct sun 1160, house 1165, and shadow 1170. Image 1115 also shows a clear and distinct ball 1175 which does not have any blurring artifacts, unlike the ball 375 from FIG. 3. This is shown more clearly by FIG. 11B.

Figure 11B:
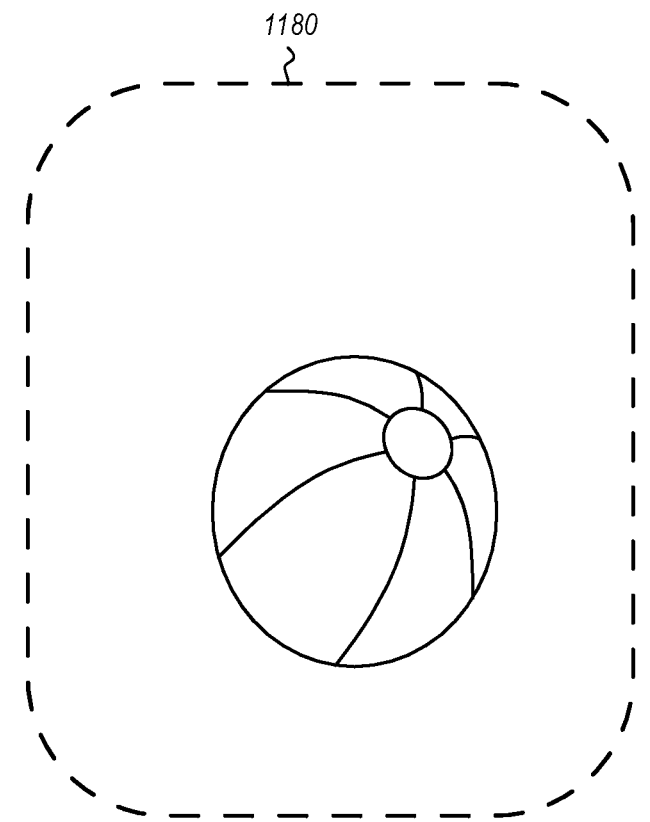

In particular, FIG. 11B shows a snapshot 1180 of the ball 1175 from FIG. 11A. As shown, the snapshot 1180 does not include any blurring artifacts, unlike the snapshot 400 from FIG. 4. This is possible because of the overlapping exposure periods for the different pixel sets, which is more fully clarified in FIG. 12. Although the discussion has focused on performing these new HDR imaging techniques on dark, moving objects (e.g., a ball in a shadowed area), the principles apply equally as well to bright, moving objects.

Figure 12:
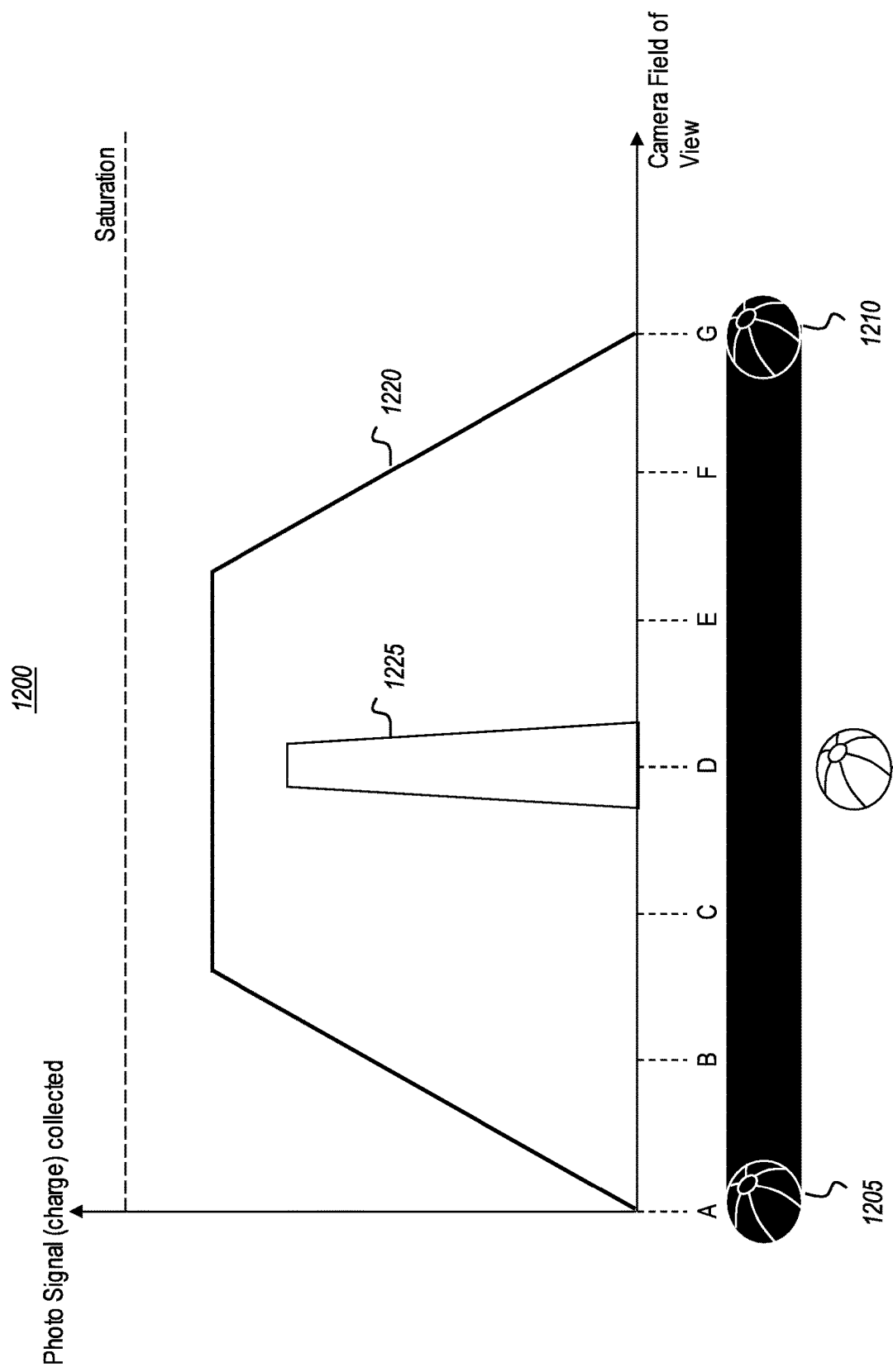
FIG. 12 shows that the exposure times for the different sets of pixels in the new configuration are triggered during overlapping periods of time.

FIG. 12 demonstrates that blurring artifacts may be avoided by overlapping the pixel sets' exposure times. In particular, the x-axis of the graph 1200 represents the image sensor's/camera's field of view, and the y-axis represents the photo signal (e.g., charge) that is collected by the pixels in the image sensor. The blurred, elongated ball 1205 (shown as starting with ball 1205 and ending with ball 1210 though they are actually the same ball just at different locations in time) correspond to the ball 1135 in FIG. 11A and results because of the long exposure period. To clarify, the ball 1205 moves from point A to B to C to D to E to F and finally to G during the long exposure period. As a result, there is a significant amount of blur or smear that is produced. The ball 1215 corresponds to the ball 1155 in FIG. 11A and does not have any blur or smear because its exposure period was very short. As shown, the exposure periods overlap. For instance, the blurred ball 1205 passes the camera's field of view from point A to G for a first set of pixels, and the ball 1215 passes the camera's field of view at point D for the second set of pixels. As described earlier, in most cases the collected charge will not cause the pixels to reach saturation, though such a scenario is possible. The plot 1220 corresponds to the long exposure period, and the plot 1225 corresponds to the short exposure period. Because the exposure periods overlap, the merging algorithm is simplified and the resulting HDR image will be vastly improved.

In this manner, the blurring artifacts from FIG. 4 can be avoided because the camera system is able to more accurately rectify the differences between the moving ball 1135 in image 1105 (from FIG. 11) and the ball 1155 from image 1110. Furthermore, because the pixels in the different sets are placed near to one another in an effective pixel area (thus having an inconsequential spatial offset), the pixels in the different sets are able to capture light from essentially the same perspective/angular reference. Even further, because there is an overlapping temporal period for their exposure times, the blurring that occurs in the prolonged exposure image can be fully rectified using the short exposure image. In this regard, generating the combined digital image is achieved by performing a compensation to reduce motion blur effects that may be present in an image.

Overlapping Exposure Periods that Last the Same Amount of Time

Figure 13:
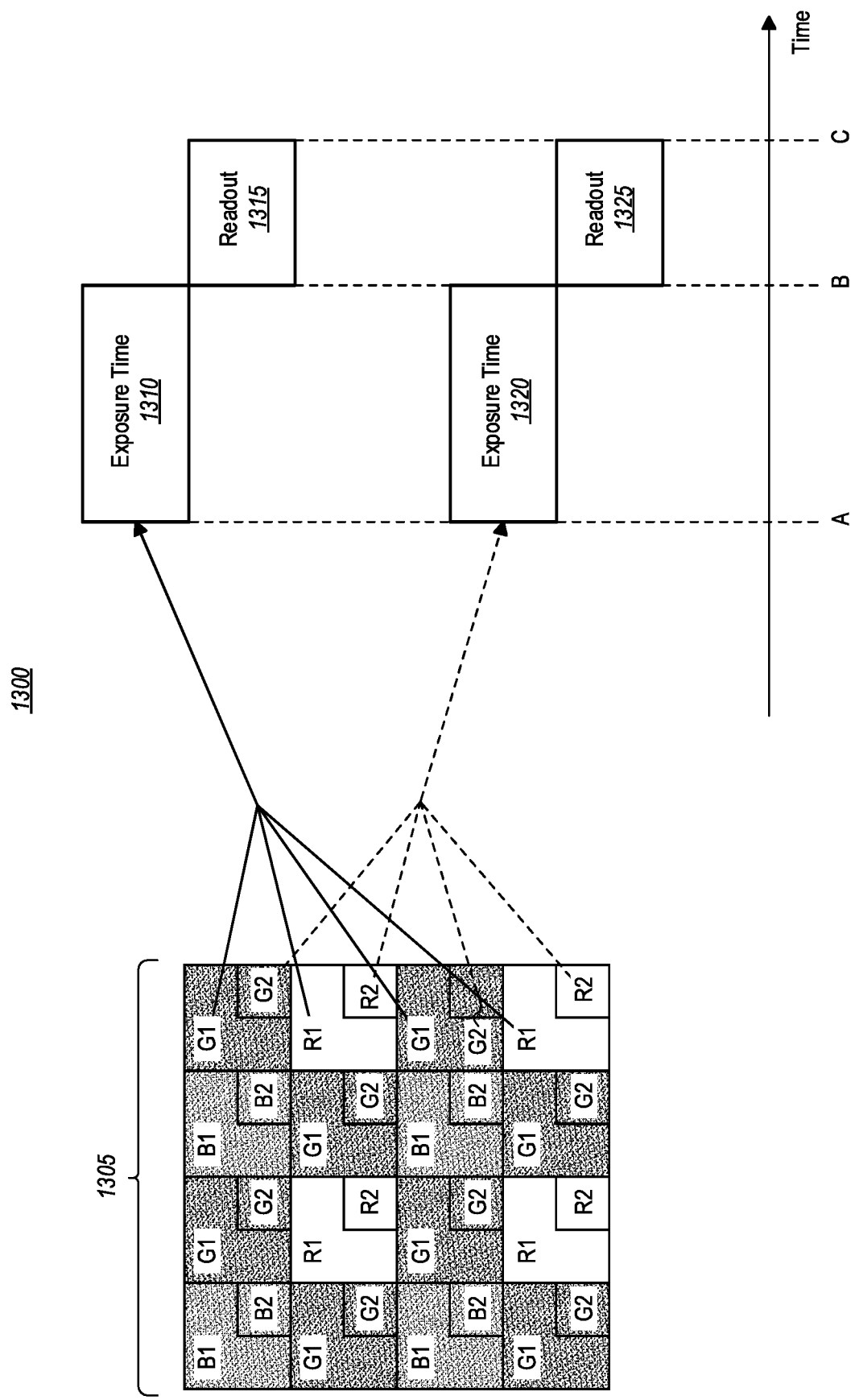
FIG. 13 demonstrates that the exposure times for the different sets of pixels may start and end at the same time.

Attention will now be directed to FIG. 13 which shows an example 1300 of the pixel exposure periods for an example configuration 1305. While the configuration 1305 is the same as configuration 800 from FIG. 8, it will be appreciated that any of the configurations from FIGS. 6 through 9 may have been used.

In contrast to the different exposure periods shown in FIG. 10, FIG. 13 shows that the exposure periods may last the same amount of time. The exposure period (or time) 1310 and the readout period 1315 both correspond to the pixels in a first set (e.g., R1, G1, and B1), and the exposure period 1320 and the readout period 1325 both correspond to the pixels in a second set (e.g., R2, G2, and B3). Both the exposure periods 1310 and 1320 begin at point "A" and end at point "B." Both the readouts 1315 and 1325 begin at point "B" and end at point "C."

Figure 14:
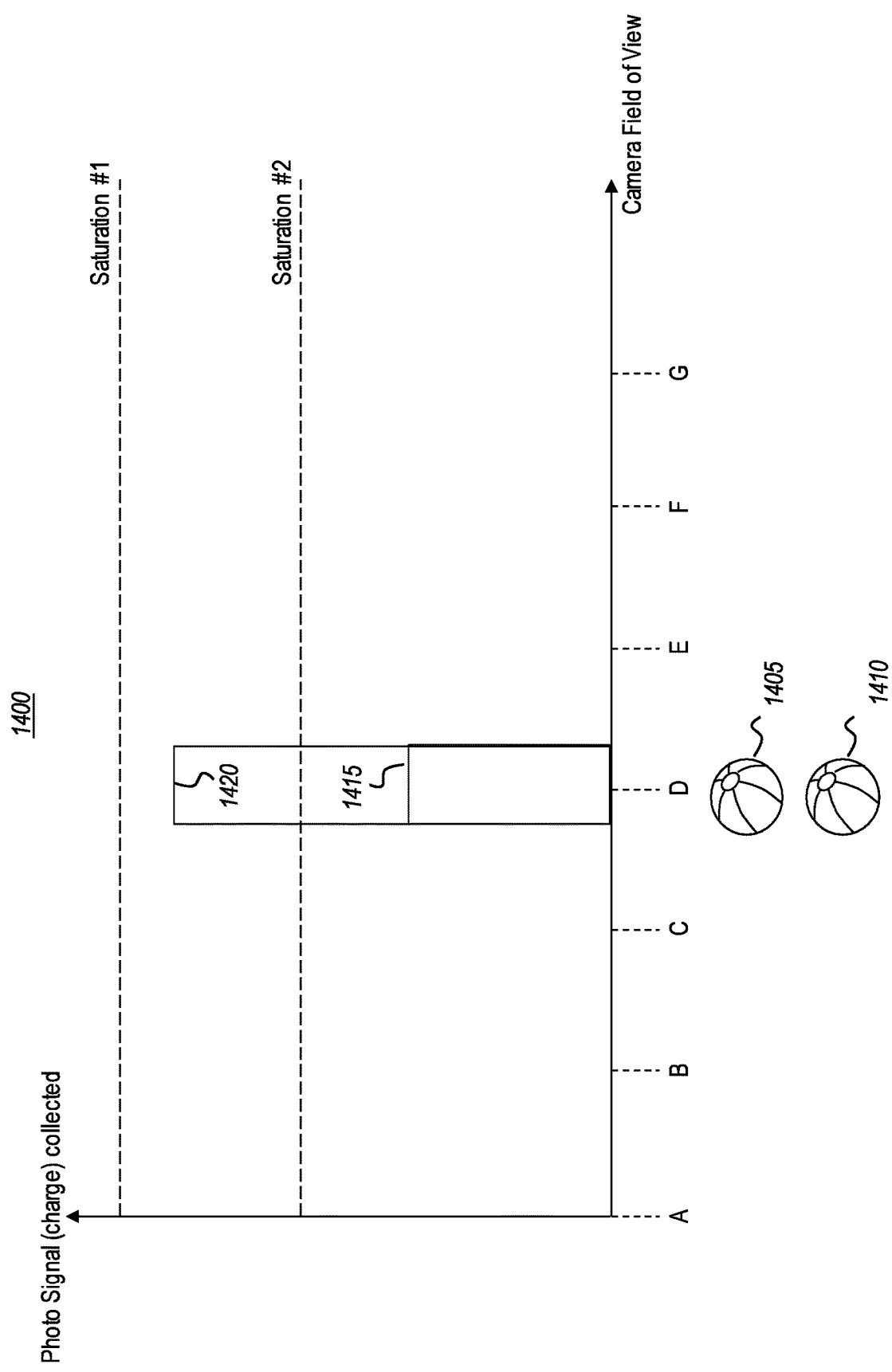
FIG. 14 provides a graphical representation of how the different sets of pixels may be exposed at the same time.

FIG. 14 further emphasizes that the exposure periods of multiple different pixel sets may last the same amount of time. In particular, the graph 1400 has the camera's field of view as the x-axis (e.g., spanning between points A, B, C, D, E, F, and G) and the photo signal (e.g., charge) collected as the y-axis. Although two balls 1405 and 1410 are illustrated, there is actually on a single ball in the environment. The ball 1405 corresponds to an image captured by one set of pixels while the ball 1410 corresponds to an image captured by a different set of pixels. Furthermore, the exposure periods for these different sets of pixels overlap and last the same amount of time, as shown by FIG. 14. Ball 1405 and 1410 are both captured at point D across the camera's field of view. As also shown by FIG. 14, the different pixel sets may have different saturation levels (e.g., Saturation #1 and Saturation #2). The differences in saturation levels occur as a result of the different full well capacities of the different pixels in each set (e.g., because of the difference in their sizes).

The plot 1415 corresponds to the exposure of a first set of pixels while the plot 1420 corresponds to the exposure of a second set of pixels. If the pixels in the first set are smaller (i.e. less surface area) than the pixels in the second set, then the pixels in the first set (corresponding to plot 1415) will likely collect fewer photons (and hence less charge) than that pixels in the second set (corresponding to plot 1420), as generally shown in FIG. 14.

In some embodiments, the collection area (i.e. the surface area of the pixel) ratio between multiple pixel sets is adjusted to optimize for the short and long exposure times. Instead of prolonging an exposure time, a larger pixel may simply be used. As such, larger pixels may be used to shorten the exposure time in cases where a long exposure would traditionally be used. At the same time, a smaller pixel will take a longer time to accumulate pixels, which may also help increase the dynamic range of the sensor. Accordingly, designing the image sensor according to these various different ways may also be used to help further reduce the effects of motion blurring.

In FIG. 14, the exposure periods have the same duration. As such, larger pixels in the effective pixel area (e.g., the plot 1425 corresponds to the larger pixel) will receive more photons than smaller pixels in the same effective pixel area. This may be beneficial because the same motion blur will be present in both images which allows the image processing to more easily rectify any blurring effects because those effects are present in multiple images.

Although not shown in FIG. 12 or 14, in some embodiments, one pixel set is exposed for a prolonged period of time. During this prolonged period of time, another pixel set may be repeatedly exposed multiple times to thereby accumulate photons at multiple different times. Therefore, instead of the single plot 1225 in FIG. 12 and the single plot 1425 in FIG. 14, the graphs 1200 and 1400 may have multiple, short exposure plots positioned at different time periods between points "A" and "G." As such, the blurring effects may also be rectified by combining/merging one prolonged exposure with multiple, short exposures.

Readout Circuitry

Figure 15:
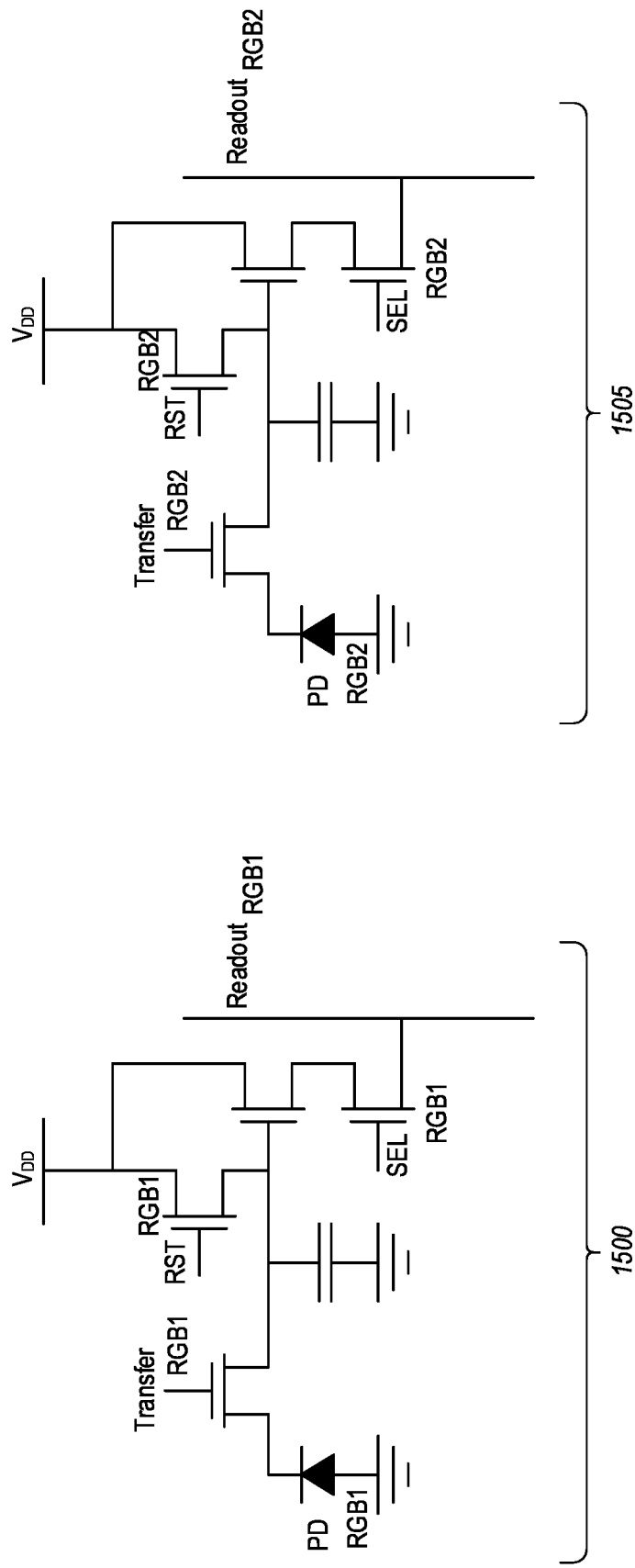
FIG. 15 shows that each pixel set is independently addressable and includes its own readout circuit.
Figure 16A:
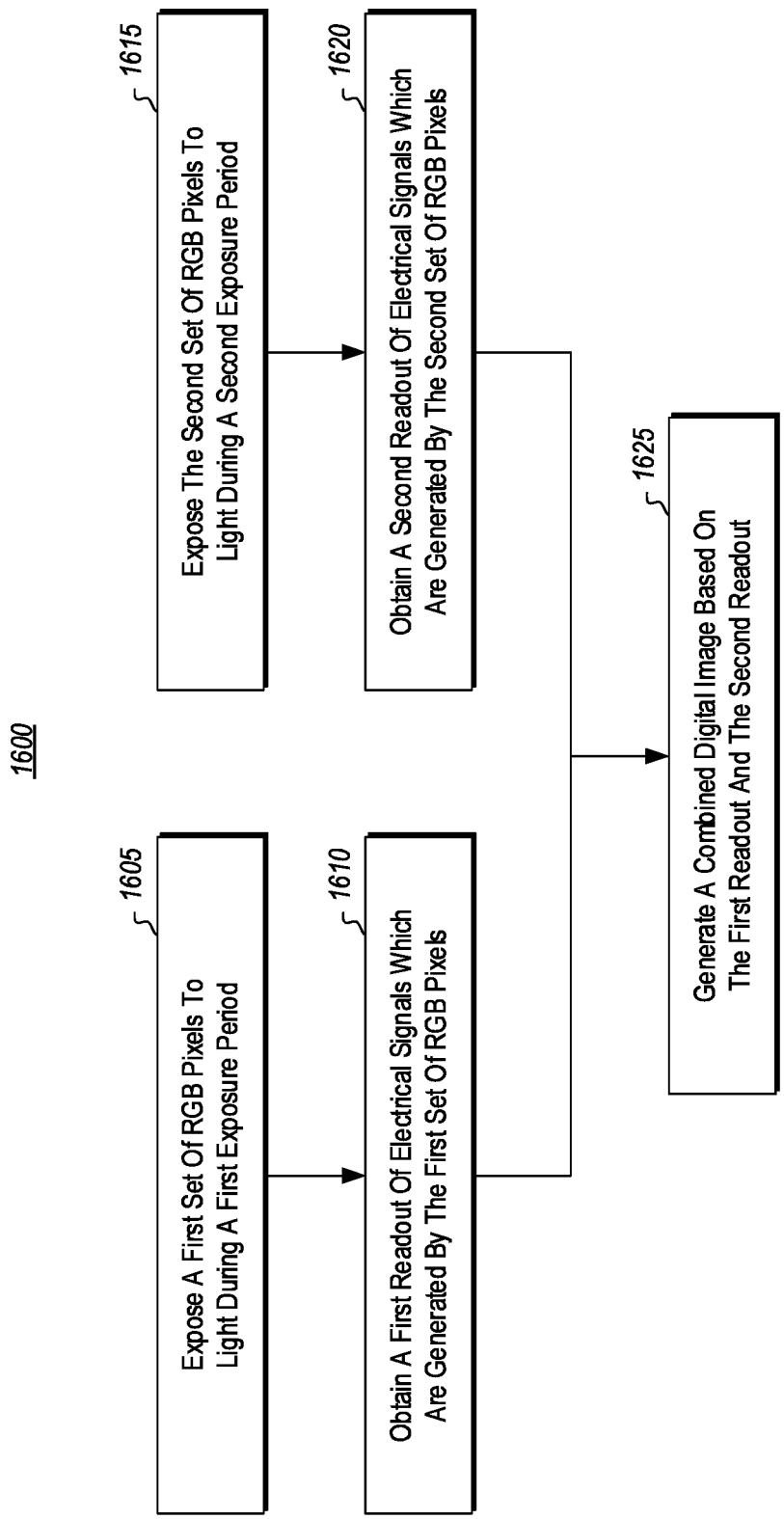
FIGS. 16A and 16B show a flowchart of an example method for improving HDR imaging using a new framework of image sensing pixels.

As discussed, each pixel set is independently addressable and has its own readout circuitry, as shown in FIG. 15. Specifically, pixel/readout circuit 1500 corresponds to a first pixel set and the pixel/readout circuit 1505 corresponds to a second pixel set. These pixel/readout circuits 1500 and 1505 may be the same (as shown in FIG. 15) or they may different, depending on the type of pixel used for each set. In pixel/readout circuit 1500, the element labeled $PD_{RGB1}$ is a photodiode (e.g., the collection area of the pixel), and the element labeled $Transfer_{RGB1}$ is a transfer gate. During the first pixel set's exposure period, $Transfer_{RGB1}$ is turned on and charge is accumulated. At the end of the exposure period, the $Transfer_{RGB1}$ is turned off. During readout, a row/column select gate (e.g., the element labeled $SEL_{RGB1}$) is turned on and the charge is amplified, converted to a voltage signal, and then transferred out of the pixel/readout circuit 1500 over a bus. To reset the pixel/readout circuit 1500, the reset gate labeled $RST_{RGB1}$ is turned on, and the pixel/readout circuit 1500 is reset. Similar operations may be performed for the pixel/readout circuit 1505.

Therefore, on the design side, additional pixel/readout circuits are used because each pixel set is now separately addressable. Accordingly, the camera computer system now supports additional circuitry, including transistors, capacitors, and analog-to-digital converters (ADC), just to name a few. To provide the separate exposure, readout, and reset periods, the transfer gates, the row/column select gates, and the reset gates are separately routed or wired. This allows the first pixel set to have a separate exposure time from the second pixel set. If three or more pixel sets were provided, then three or more pixel/readout circuits would be provided in a corresponding manner. It should be noted that some camera systems include pipelining functionalities in that they can readout a frame concurrently with when a set of pixels are exposed. Accordingly, some of the disclosed embodiments also support this functionality.

Example Method(s)

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Figure 16B:
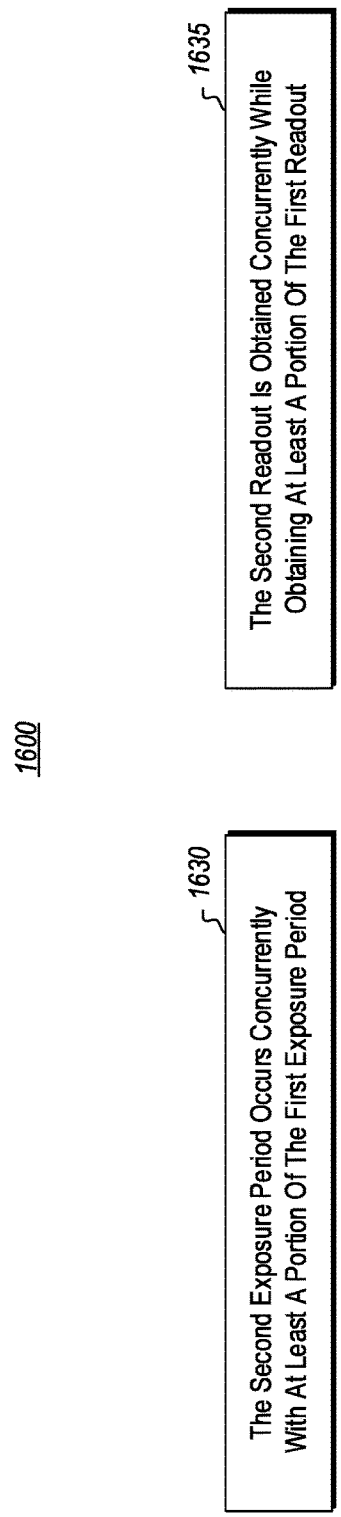
Figure 17:
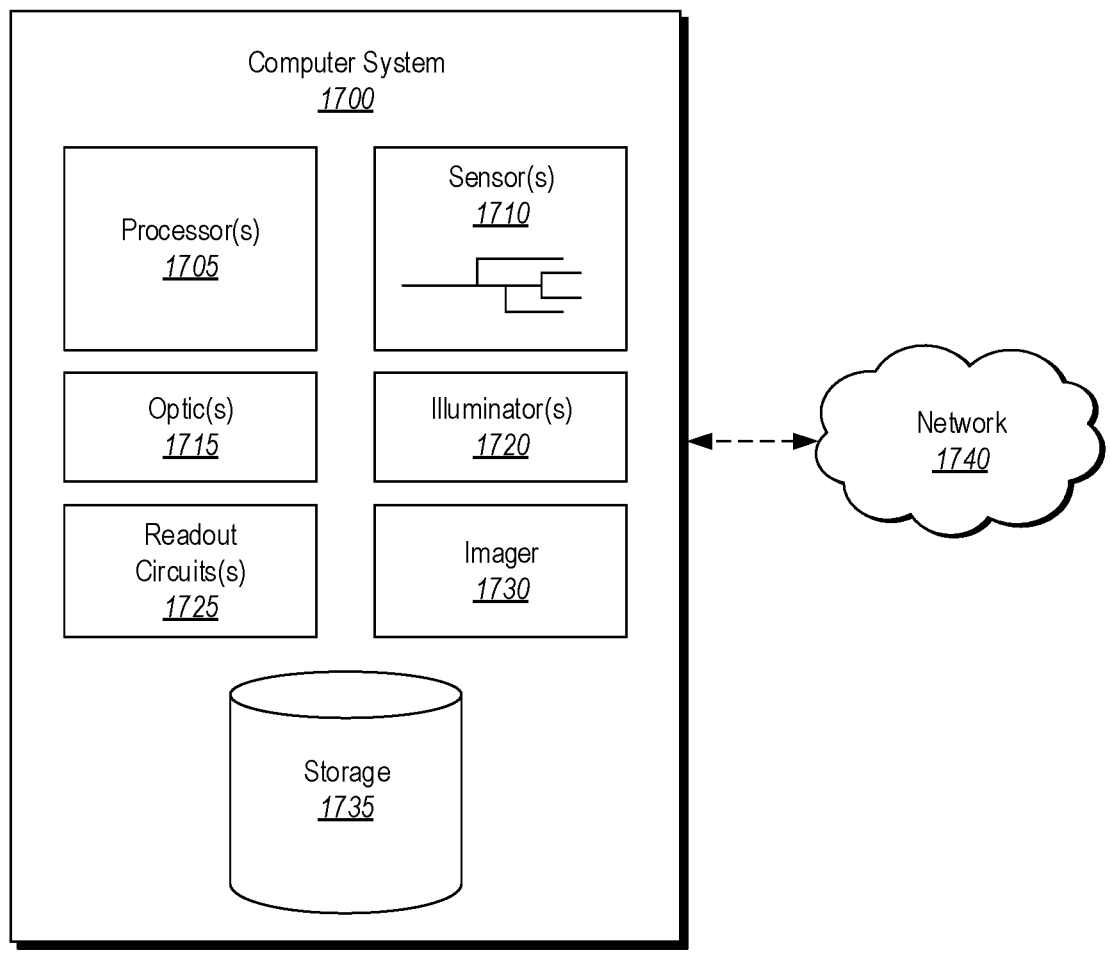
FIG. 17 illustrates an example computer system that may be used to facilitate the disclosed operations.

Attention will now be directed to FIGS. 16A and 16B which show an example flowchart 1600 of a method for generating an improved HDR image using the new pixel framework discussed above in connection with FIGS. 6 through 15. Some of the method acts are shown side by side to each other to demonstrate that there might not be a temporal dependency between these operations.

As described earlier, the pixel framework now includes multiple sets of RGB pixels arranged within each effective pixel area. Initially, a first set is exposed to light during a first exposure period (act 1605). In some embodiments, this light first passes through one or more optical components of a camera (e.g., a lens). Using FIG. 8 as a reference, this first set might be all of the R1, G1, and B1 pixels.

Next, a first readout is obtained (act 1610). This readout obtains electrical signals that are generated by the first set of RGB pixels in response to the light received and detected by that first set during the first exposure period. This operation may be performed by the readout circuit 1500 shown in FIG. 15.

The method also includes an act (act 1615) of exposing the second set of RGB pixels to light that is received through the one or more optical components of the camera during a second exposure period. Afterwards, a second readout is obtained (act 1620). This readout obtains electrical signals that are generated by the second set of RGB pixels in response to the light received and detected by the second set of RGB pixels during the second exposure period.

Thereafter, there is an act (act 1625) of generating a combined digital image based on the first readout and the second readout. As described earlier, this combined digital image is generated by selectively choosing various portions from the first readout and merging those portions with various portions from the second readout. Some portions may be more influential or weighted more than other portions. If more than two readouts were performed (e.g., in scenarios where there are three or more pixel sets within each effective pixel area), then the combined digital image will be generated using content from three separate images. An example of this image is shown by image 1115 in FIG. 11A. In some embodiment, any portion of one pixel set's exposure period and/or readout period may overlap with any portion of either the exposure period and/or the readout period of a different set of pixels. Accordingly, the embodiments support overlapping exposure and/or readout periods from any number of pixel sets.

In some embodiments, at least a portion of the second exposure period occurs concurrently with at least a portion of the first exposure period (act 1630 in FIG. 16B). These parallel operations are illustrated in both FIGS. 12 and 14. Furthermore, in some embodiments, at least a portion of the time taken to perform this second readout overlaps with at least a portion of the time taken to perform the first readout (act 1635 shown in FIG. 16B).

While the foregoing illustrations and examples have focused on scenarios in which only a RGB sensor is used, it will be appreciated that other types of light sensors may also be used. For example, instead of a red, green, blue pixel configuration, the embodiments may comprise a first set of monochrome pixels and a second set of monochrome pixels. Each monochrome pixel in the second set is positioned proximately to at least one monochrome pixel in the first set. In this manner, each monochrome effective pixel area may be comprised of pixels from the first and second pixel sets. Similarly, for embodiments in which the monochrome pixel sets include multiple sets of a single color, any number of monochrome pixel sets may be included in each effective pixel area. For example, pixels from 2, 3, 4, or more different sets (of the same color) may be included in each effective pixel area.

Relatedly, the image sensor may be comprised of different sets of infrared (IR) pixels. For instance, a particular effective pixel area may include any number of pixels from any number of different pixel sets. These pixels are located proximately to one another to form the effective pixel area. As such, a first set of IR pixels may sense IR light during a first exposure period, and a second set of IR pixels may sense IR light during a second, but overlapping, exposure period. A similar configuration may be made for CMYK pixels.

Even further, some embodiments may include combinations of the above. For example, in one effective pixel area, there may be a first red pixel from a first pixel set, a second red pixel from a second pixel set, a first IR pixel (or monochrome pixel) from a third pixel set, and a second IR pixel (or monochrome pixel) from a fourth pixel set. Similar configurations may be made for the blue and green pixels. In this manner, each effective pixel area may include pixels from four different sets, namely, 2 visible light pixels (each from a different set), and 2 IR or monochrome pixels (each from a different set).

The scope of this disclosure also includes any combinations of the foregoing pixel sets. Furthermore, it will be appreciated that the foregoing embodiments can be implemented to help improve the manner in which HDR imaging is performed, particularly for scenarios in which HDR imaging is used to capture images of environments that include moving objects. By following the disclosed principles, the quality HDR images can be significantly improved by at least helping to reduce and/or eliminate blurring artifacts.

Example Computer Systems

Having just described the various features and functionalities of some of the disclosed embodiments, the focus will now be directed to FIG. 17 which illustrates an example computer system 1700 that may be used to facilitate the operations described herein. The computer system 1700 may take various different forms. For example, the computer system 1700 may be embodied as a head-mounted device (HMD), a camera computer system, a distributed system that includes one or more connected computing components/devices that are in communication with the computer system, a desktop computer, a laptop, a tablet, a mobile phone, server, data center and/or any other computer system.

In its most basic configuration, the computer system 1700 includes various different components. For example, FIG. 17 shows that computer system 1700 includes at least one hardware processing unit 1705 (aka a "processor"), sensors 1710 (e.g., the spatially multiplexed image sensor that is described throughout this disclosure and that includes the different pixel sets), optics 1715 (e.g., for the camera which is considered to be one of the sensors 1710), illuminators 1720, readout circuitry 1725, an imager component 1730 (e.g., to perform the image processing), and storage 1735.

The storage 1735 may be physical system memory, which may be volatile, non-volatile, or some combination of the two. The term "memory" may also be used herein to refer to non-volatile mass storage such as physical storage media. If the computer system 1700 is distributed, the processing, memory, and/or storage capability may be distributed as well. As used herein, the term "executable module," "executable component," or even "component" can refer to software objects, routines, or methods that may be executed on the computer system 1700. The different components, modules, engines, and services described herein may be implemented as objects or processors that execute on the computer system 1700 (e.g. as separate threads).

The disclosed embodiments may comprise or utilize a special-purpose or general-purpose computer including computer hardware, such as, for example, one or more processors (such the hardware processing unit 1705) and system memory (such as storage 1735), as discussed in greater detail below. Embodiments also include physical and other computer-readable media for carrying or storing computer-executable instructions and/or data structures. Such computer-readable media can be any available media that can be accessed by a general-purpose or special-purpose computer system. Computer-readable media that store computer-executable instructions in the form of data are physical computer storage media. Computer-readable media that carry computer-executable instructions are transmission media. Thus, by way of example and not limitation, the current embodiments can comprise at least two distinctly different kinds of computer-readable media: computer storage media and transmission media.

Computer storage media are hardware storage devices, such as RAM, ROM, EEPROM, CD-ROM, solid state drives (SSDs) that are based on RAM, Flash memory, phase-change memory (PCM), or other types of memory, or other optical disk storage, magnetic disk storage or other magnetic storage devices, or any other medium that can be used to store desired program code means in the form of computer-executable instructions, data, or data structures and that can be accessed by a general-purpose or special-purpose computer.

The computer system 1700 may also be connected (via a wired or wireless connection) to external sensors (e.g., one or more remote cameras, accelerometers, gyroscopes, acoustic sensors, magnetometers, etc.). Further, the computer system 1700 may also be connected through one or more wired or wireless networks 1740 to remote systems(s) that are configured to perform any of the processing described with regard to computer system 1700.

A "network," like the network 1740 shown in FIG. 17, is defined as one or more data links and/or data switches that enable the transport of electronic data between computer systems, modules, and/or other electronic devices. When information is transferred, or provided, over a network (either hardwired, wireless, or a combination of hardwired and wireless) to a computer, the computer properly views the connection as a transmission medium. The computer system 1700 will include one or more communication channels that are used to communicate with the network 1740. Transmissions media include a network that can be used to carry data or desired program code means in the form of computer-executable instructions or in the form of data structures. Further, these computer-executable instructions can be accessed by a general-purpose or special-purpose computer. Combinations of the above should also be included within the scope of computer-readable media.

Upon reaching various computer system components, program code means in the form of computer-executable instructions or data structures can be transferred automatically from transmission media to computer storage media (or vice versa). For example, computer-executable instructions or data structures received over a network or data link can be buffered in RAM within a network interface module (e.g., a network interface card or "NIC") and then eventually transferred to computer system RAM and/or to less volatile computer storage media at a computer system. Thus, it should be understood that computer storage media can be included in computer system components that also (or even primarily) utilize transmission media.

Computer-executable (or computer-interpretable) instructions comprise, for example, instructions that cause a general-purpose computer, special-purpose computer, or special-purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the embodiments may be practiced in network computing environments with many types of computer system configurations, including personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The embodiments may also be practiced in distributed system environments where local and remote computer systems that are linked (either by hardwired data links, wireless data links, or by a combination of hardwired and wireless data links) through a network each perform tasks (e.g. cloud computing, cloud services and the like). In a distributed system environment, program modules may be located in both local and remote memory storage devices.

Additionally or alternatively, the functionality described herein can be performed, at least in part, by one or more hardware logic components (e.g., the hardware processing unit 1205). For example, and without limitation, illustrative types of hardware logic components that can be used include Field-Programmable Gate Arrays (FPGAs), Program-Specific or Application-Specific Integrated Circuits (ASICs), Program-Specific Standard Products (ASSPs), System-On-A-Chip Systems (SOCs), Complex Programmable Logic Devices (CPLDs), Central Processing Units (CPUs), and other types of programmable hardware.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A spatially multiplexed image sensor comprising:
a first set of red, green, blue (RGB) pixels, each pixel of the first set of RGB pixels being routed to one or more first reset gates; and
a second set of RGB pixels, each pixel of the second set of RGB pixels being routed to one or more second reset gates that are separate from the one or more first reset gates, wherein:
each red pixel in the second set of RGB pixels is positioned proximately to at least one red pixel in the first set of RGB pixels,
each green pixel in the second set of RGB pixels is positioned proximately to at least one green pixel in the first set of RGB pixels, and
each blue pixel in the second set of RGB pixels is positioned proximately to at least one blue pixel in the first set of RGB pixels.

2. The spatially multiplexed image sensor of claim 1, wherein each pixel in the second set of RGB pixels is of a same size as each pixel in the first set of RGB pixels.

3. The spatially multiplexed image sensor of claim 1, wherein each pixel in the second set of RGB pixels is of a different size than each pixel in the first set of RGB pixels.

4. The spatially multiplexed image sensor of claim 1, wherein a size of each pixel in the second set of RGB pixels is ⅓ of a size of each pixel in the first set of RGB pixels.

5. The spatially multiplexed image sensor of claim 1, wherein a first red pixel of the first set of RGB pixels is shaped as a right-angled hexagon, wherein a second red pixel of the second set of RGB pixels is positioned proximately to the first red pixel, the second red pixel having a square shape, and wherein a form factor of a combination of the first red pixel and the second red pixel forms a square shape.

6. The spatially multiplexed image sensor of claim 1, wherein the spatially multiplexed image sensor is a global shutter image sensor.

7. The spatially multiplexed image sensor of claim 1, wherein the spatially multiplexed image sensor is a rolling shutter image sensor.

8. The spatially multiplexed image sensor of claim 1, wherein each pixel in the second set of RGB pixels is shaped symmetrically, and wherein each pixel in the first set of RGB pixels is shaped asymmetrically.

9. The spatially multiplexed image sensor of claim 1, wherein each pixel in the second set of RGB pixels is shaped as a square having a dimension of 3 microns by 3 microns or smaller.

10. The spatially multiplexed image sensor of claim 1, wherein each pixel in the first set of RGB pixels is shaped as a right-angled hexagon having dimensions of 3 microns by 3 microns by 2 microns by 1 micron by 1 micron by 2 microns.

11. The spatially multiplexed image sensor of claim 1, wherein the spatially multiplexed image sensor further includes a third set of RGB pixels, and wherein each red pixel in the third set of RGB pixels is positioned proximately to at least one red pixel in the first set or second set of RGB pixels, each green pixel in the third set is positioned proximately to at least one green pixel in the first set of RGB pixels or second set of RGB pixels, and each blue pixel in the third set is positioned proximately to at least one blue pixel in the first set of RGB pixels or the second set of RGB pixels.

12. The spatially multiplexed image sensor of claim 1, wherein the spatially multiplexed image sensor is a part of a computer system comprising:
 one or more processors; and
 one or more computer-readable hardware storage devices having stored thereon computer-executable instructions that are executable by the one or more processors to cause the computer system to:
  expose the first set of RGB pixels to light that is received through one or more optical components of a camera during a first exposure period;
  obtain a first readout of electrical signals which are generated by the first set of RGB pixels in response to the light received and detected by the first set of RGB pixels during the first exposure period;
  expose the second set of RGB pixels to light that is received through the one or more optical components of the camera during a second exposure period, the second exposure period occurring concurrently with at least a portion of the first exposure period;
  obtain a second readout of electrical signals which are generated by the second set of RGB pixels in response to the light received and detected by the second set of RGB pixels during the second exposure period; and
 generate a combined digital image based on the first readout and the second readout.

13. The spatially multiplexed image sensor of claim 1, wherein the spatially multiplexed image sensor is a part of a computer system comprising:
 one or more processors; and
 one or more computer-readable hardware storage devices having stored thereon computer-executable instructions that are executable by the one or more processors to cause the computer system to:
  expose the first set of RGB pixels to light that is received through one or more optical components of a camera during a first exposure period;
  obtain a first readout of electrical signals which are generated by the first set of RGB pixels in response to the light received and detected by the first set of RGB pixels during the first exposure period;
  expose the second set of RGB pixels to light that is received through the one or more optical components of the camera during a second exposure period;
  obtain a second readout of electrical signals which are generated by the second set of RGB pixels in response to the light received and detected by the second set of RGB pixels during the second exposure period, wherein the second readout is obtained concurrently while obtaining at least a portion of the first readout; and
  generate a combined digital image based on the first readout and the second readout.

14. The spatially multiplexed image sensor of claim 1, wherein the spatially multiplexed image sensor is a part of a computer system comprising:
 one or more processors; and
 one or more computer-readable hardware storage devices having stored thereon computer-executable instructions that are executable by the one or more processors to cause the computer system to:
  expose the first set of RGB pixels to light that is received through one or more optical components of a camera during a first exposure period;
  obtain a first readout of electrical signals which are generated by the first set of RGB pixels in response to the light received and detected by the first set of RGB pixels during the first exposure period;
  expose the second set of RGB pixels to light that is received through the one or more optical components of the camera during a second exposure period, the second exposure period occurring concurrently with at least a portion of the first exposure period;
  obtain a second readout of electrical signals which are generated by the second set of RGB pixels in response to the light received and detected by the second set of RGB pixels during the second exposure period, wherein the second readout is obtained concurrently while obtaining at least a portion of the first readout; and
  generate a combined digital image based on the first readout and the second readout.

15. A computer system comprising:
 one or more processors;
 a spatially multiplexed image sensor comprising a first set of red, green, blue (RGB) pixels and a second set of RGB pixels, each red pixel in the second set is positioned proximately to at least one red pixel in the first set of RGB pixels, each green pixel in the second set is positioned proximately to at least one green pixel in the first set of RGB pixels, and each blue pixel in the second set is positioned proximately to at least one blue pixel in the first set of RGB pixels; and
 one or more computer-readable hardware storage devices having stored thereon computer-executable instructions that are executable by the one or more processors to cause the computer system to:
  expose the first set of RGB pixels to light that is received through one or more optical components of a camera during a first exposure period, the first exposure period beginning at a first timepoint and ending at a second timepoint;

obtain a first readout of electrical signals which are generated by the first set of RGB pixels in response to the light received and detected by the first set of RGB pixels during the first exposure period;

expose the second set of RGB pixels to light that is received through the one or more optical components of the camera during a second exposure period, the second exposure period occurring concurrently with at least a portion of the first exposure period, the second exposure period beginning after the first timepoint and ending before the second timepoint;

obtain a second readout of electrical signals which are generated by the second set of RGB pixels in response to the light received and detected by the second set of RGB pixels during the second exposure period; and generate a combined digital image based on the first readout and the second readout.

16. The computer system of claim 15, wherein the first exposure period ranges between 10 micro-seconds and 500 milli-seconds.

17. The computer system of claim 15, wherein the second exposure period is at least 5 micro-seconds.

18. The computer system of claim 15, wherein the second exposure period is the same as the first exposure period.

19. A computer system comprising:
one or more processors;
a spatially multiplexed image sensor comprising a first set of red, green, blue (RGB) pixels and a second set of RGB pixels, each red pixel in the second set is positioned proximately to at least one red pixel in the first set of RGB pixels, each green pixel in the second set is positioned proximately to at least one green pixel in the first set of RGB pixels, and each blue pixel in the second set is positioned proximately to at least one blue pixel in the first set of RGB pixels; and one or more computer-readable hardware storage devices having stored thereon computer-executable instructions that are executable by the one or more processors to cause the computer system to:

expose the first set of RGB pixels to light that is received through one or more optical components of a camera during a first exposure period, the first exposure period beginning at a first timepoint and ending at a second timepoint;

obtain a first readout of electrical signals which are generated by the first set of RGB pixels in response to the light received and detected by the first set of RGB pixels during the first exposure period;

expose the second set of RGB pixels to light that is received through the one or more optical components of the camera during a second exposure period, the second exposure period beginning after the first timepoint and ending before the second timepoint;

obtain a second readout of electrical signals which are generated by the second set of RGB pixels in response to the light received and detected by the second set of RGB pixels during the second exposure period, wherein the second readout is obtained concurrently while obtaining at least a portion of the first readout; and generate a combined digital image based on the first readout and the second readout.

20. The computer system of claim 19, wherein generating the combined digital image includes performing a compensation to reduce motion blur associated with an image generated from at least the first readout.

21. The spatially multiplexed image sensor of claim 1, wherein each pixel of the first set of RGB pixels is routed to one or more first row/column select gates, and wherein each pixel of the second set of RGB pixels is routed to one or more second row/column select gates that are separate from the one or more first row/column select gates.

* * * * *